(12) United States Patent
Kawanami

(10) Patent No.: US 9,714,959 B2
(45) Date of Patent: Jul. 25, 2017

(54) CURRENT SENSOR AND ELECTRONIC DEVICE INCORPORATING THE SAME

(71) Applicant: Murata Manufacturing Co., Ltd., Nagaokakyo-shi, Kyoto-fu (JP)

(72) Inventor: Takashi Kawanami, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 33 days.

(21) Appl. No.: 14/831,018

(22) Filed: Aug. 20, 2015

(65) Prior Publication Data

US 2015/0355241 A1    Dec. 10, 2015

Related U.S. Application Data

(63) Continuation of application No. PCT/JP2014/053007, filed on Feb. 10, 2014.

(30) Foreign Application Priority Data

Feb. 27, 2013    (JP) .................................. 2013-036958

(51) Int. Cl.
*G01R 15/20*    (2006.01)
*G01R 19/20*    (2006.01)

(52) U.S. Cl.
CPC ........... *G01R 15/20* (2013.01); *G01R 15/205* (2013.01); *G01R 15/202* (2013.01); *G01R 15/207* (2013.01); *G01R 19/20* (2013.01)

(58) Field of Classification Search
CPC .................................................... G01R 15/185
USPC ....................................................... 324/117 R
See application file for complete search history.

(56) References Cited

U.S. PATENT DOCUMENTS

| | | | | |
|---|---|---|---|---|
| 5,621,377 A | * | 4/1997 | Dettmann | G01R 15/205 324/117 R |
| 6,034,785 A | * | 3/2000 | Itoh | G06K 15/00 358/1.18 |
| 6,040,690 A | | 3/2000 | Ladds | |
| 6,512,359 B1 | * | 1/2003 | Tamai | G01R 15/207 324/117 H |

(Continued)

FOREIGN PATENT DOCUMENTS

| | | | | |
|---|---|---|---|---|
| DE | 10110254 | * | 9/2002 | ............ G01R 15/20 |
| DE | 10110254 A1 | | 9/2002 | |

(Continued)

OTHER PUBLICATIONS

International Search Report PCT/JP2014/053007, May 13, 2014, 2 pages.*

(Continued)

*Primary Examiner* — Clayton E Laballe
*Assistant Examiner* — Kevin Butler
(74) *Attorney, Agent, or Firm* — Arent Fox LLP

(57) ABSTRACT

A busbar module including a busbar through which current of a measurement subject flows and a hold portion that holds the busbar and has a recess portion), the busbar and the hold portion being integrally formed; and a magnetic sensor module including a magnetic sensor that detects an intensity of a magnetic field generated by the current flowing through the busbar, and being able to be selectively assembled with the busbar module by housing the magnetic sensor module to the recess portion of the hold portion are included.

34 Claims, 21 Drawing Sheets

(56) References Cited

U.S. PATENT DOCUMENTS

| | | | |
|---|---|---|---|
| 7,230,414 B2* | 6/2007 | Bruno | G01R 21/06 324/117 R |
| 7,583,072 B2* | 9/2009 | Muraki | G01R 15/207 324/117 H |
| 7,663,358 B2* | 2/2010 | Hashio | G01R 15/207 264/254 |
| 7,855,546 B2* | 12/2010 | Aratani | G01R 15/207 324/117 H |
| 8,415,948 B2* | 4/2013 | Ueno | G01R 15/20 324/117 H |
| 8,994,365 B2* | 3/2015 | Kawaguchi | G01R 1/18 324/117 H |
| 9,201,101 B2* | 12/2015 | Nomura | G01R 19/0092 |
| 9,417,269 B2* | 8/2016 | Sakai | G01R 15/205 |
| 9,476,915 B2* | 10/2016 | Ausserlechner | G01R 15/202 |
| 2002/0180417 A1* | 12/2002 | Colby | G01R 15/18 324/117 R |
| 2006/0043960 A1* | 3/2006 | Itoh | G01R 15/202 324/117 R |
| 2009/0021249 A1 | 1/2009 | Kumar et al. | |
| 2010/0109643 A1* | 5/2010 | Storkey | G01R 15/181 324/117 R |
| 2011/0050222 A1 | 3/2011 | Ueno et al. | |
| 2011/0058391 A1 | 3/2011 | Ueno | |
| 2013/0169267 A1* | 7/2013 | Miyakoshi | G01R 15/207 324/117 R |
| 2013/0187633 A1* | 7/2013 | Yasui | G01R 15/207 324/117 R |
| 2015/0015241 A1* | 1/2015 | Tamura | G01R 33/091 324/117 R |
| 2016/0146858 A1* | 5/2016 | Miyakoshi | G01R 15/20 324/117 R |
| 2016/0258985 A1* | 9/2016 | Nomura | G01R 33/09 |
| 2016/0327594 A1* | 11/2016 | Peczalski | G01R 15/207 |

FOREIGN PATENT DOCUMENTS

| | | | |
|---|---|---|---|
| EP | 0181759 A2 | 5/1988 | |
| JP | H06-294854 A | 10/1994 | |
| JP | H08-233864 A | 9/1996 | |
| JP | H10-294854 A | 11/1998 | |
| JP | 2006-184269 A | 7/2006 | |
| JP | 2007-171156 A | 7/2007 | |
| JP | 2007171156 * | 7/2007 | G01R 15/20 |
| JP | 2009-216456 A | 9/2009 | |
| JP | 2009216456 * | 9/2009 | G01R 15/20 |
| JP | 2010185848 A | 8/2010 | |
| JP | 2012-018024 A | 1/2012 | |

OTHER PUBLICATIONS

Written Opinion International Searching Authority PCT/JP2014/053007, May 13, 2014, 4 pages.*
Jacob Fraden, Handbook of Modern Sensors Physics, Designs, and Applications Fourth Edition, Springer, 2010, Chapter 7.*
Pavel Ripka and Alois Tipek, Modern Sensors Handbook, ISTE, 2007, Chapter 10.*
International Search Report issued for PCT/JP2014/053007, mail date May 13, 2014.
Written Opinion of the International Searching Authority issued for PCT/JP2014/053007, mail date May 13, 2014.

* cited by examiner

# CURRENT SENSOR AND ELECTRONIC DEVICE INCORPORATING THE SAME

CROSS REFERENCE TO RELATED APPLICATIONS

The present application is a continuation of PCT/JP2014/053007 filed Feb. 10, 2014, which claims priority to Japanese Patent Application No. 2013-036958, filed Feb. 27, 2013, the entire contents of each of which are incorporated herein by reference.

FIELD OF THE INVENTION

The present invention relates to a current sensor and an electronic device incorporating the current sensor. In particular, the present invention relates to a current sensor that detects the value of current of a measurement subject by measuring the intensity of a magnetic field generated in accordance with the current of the measurement subject, and an electronic device incorporating the current sensor.

BACKGROUND OF THE INVENTION

There is Japanese Unexamined Patent Application Publication No. 6-294854 as a prior art document that discloses a configuration of a sensor chip being a magnetic sensor whose output signal is proportional to current of a measurement subject. This sensor chip is arranged at a busbar through an insulator. The busbar is a conductor through which the current of the measurement subject flows.

Also, a plurality of planar pieces are formed on the surface of the sensor chip. The planar pieces serve as external contacts. These planar pieces are connected to pins integrally formed with the busbar and provided for power feed and output extraction of the sensor chip. Hence, the busbar and the magnetic sensor are integrally formed.

Patent Document 1: Japanese Unexamined Patent Application Publication No. 6-294854.

In the case in which the busbar and the magnetic sensor are integrally formed in the current sensor, a user of the current sensor could not customize the current sensor by selecting a combination of a structure of busbar and a type of magnetic sensor.

SUMMARY OF THE INVENTION

The invention is made in light of the situations, and an object of the invention is to provide a current sensor that allows a user of the current sensor to customize the current sensor by selecting a combination of a structure of busbar and a type of magnetic sensor, and an electronic device incorporating the current sensor.

A current sensor according to the invention includes a busbar module including a busbar through which current of a measurement subject flows and a hold portion that holds the busbar and has an assembly portion, the busbar and the hold portion being integrally formed; and a magnetic sensor module including a magnetic sensor that detects an intensity of a magnetic field generated by the current flowing through the busbar, and being able to be selectively assembled with the busbar module by assembling the magnetic sensor module to the assembly portion of the hold portion.

In an aspect of the invention, the assembly portion of the hold portion is a recess portion having a fitting structure. The magnetic sensor module has an outer shape that has directivity with respect to the recess portion and is fitted to the recess portion.

In an aspect of the invention, the busbar module includes an electrical device held by the hold portion together with the busbar in a state in which the electrical device is connected to the busbar.

In an aspect of the invention, the busbar includes a plurality of busbar portions extending in parallel to each other with a gap interposed thereamong. The recess portion is located between the busbars neighboring to each other. In a state in which the magnetic sensor module is housed in the recess portion, the magnetic sensor has a detection axis in a direction orthogonal to a direction in which the plurality of busbar portions are arranged and a direction orthogonal to an extending direction of the busbar portions. In the direction of the detection axis, a dimension of a width of each of the plurality of busbar portions is 1.5 times of a dimension of the gap between the busbar portions neighboring to each other.

In an aspect of the invention, the magnetic sensor has odd function input/output characteristics and detects the intensity of the magnetic field generated by the current flowing through the busbar.

In an aspect of the invention, the magnetic sensor module further includes calculating means for calculating a value of the current by arithmetically operating a detection value of the magnetic sensor.

In an aspect of the invention, the current sensor includes, as the magnetic sensor, a first magnetic sensor and a second magnetic sensor. Regarding the intensity of the magnetic field generated by the current flowing through the busbar, a phase of a detection value of the first magnetic sensor is opposite to a phase of a detection value of the second magnetic sensor. The calculating means is a subtracter.

In an aspect of the invention, the current sensor includes, as the magnetic sensor, a first magnetic sensor and a second magnetic sensor. Regarding the intensity of the magnetic field generated by the current flowing through the busbar, a phase of a detection value of the first magnetic sensor is the same as a phase of a detection value of the second magnetic sensor. The calculating means is an adder.

In an aspect of the invention, the magnetic sensor module includes a circuit having a closed loop of an exciting coil.

In an aspect of the invention, the busbar module has a first recess portion and a second recess portion as the recess portion. A first magnetic sensor module including the first magnetic sensor is housed in the first recess portion. A second magnetic sensor module including the second magnetic sensor is housed in the second recess portion.

In an aspect of the invention, the busbar includes, as the plurality of busbar portions, a first busbar portion and a second busbar portion electrically connected in parallel to each other and extending in parallel to each other with a gap interposed therebetween, and a third busbar portion located at an intermediate position between the first busbar portion and the second busbar portion and extending in parallel to each of the first busbar portion and the second busbar portion with a gap interposed therebetween. A direction in which the current flows through the first busbar portion is the same as a direction in which the current flows through the second busbar portion. The direction in which the current flows through the first busbar portion and the direction in which the current flows through the second busbar portion are opposite to a direction in which the current flows through the third busbar portion. The first recess portion is located between the first busbar portion and the third busbar portion.

The second recess portion is located between the second busbar portion and the third busbar portion.

In an aspect of the invention, the first busbar portion and the second busbar portion are line-symmetrically arranged to each other in a cross section about a center line of the third busbar portion in the direction of the detection axis. The first recess portion and the second recess portion are line-symmetrically arranged to each other in the cross section about the center line of the third busbar portion in the direction of the detection axis.

In an aspect of the invention, the hold portion is formed of a resin material.

In an aspect of the invention, the busbar includes an input terminal portion for inputting current to the busbar, and an output terminal portion for outputting current from the busbar. The input terminal portion and the output terminal portion are located in the same plane and extend in mutually opposite directions in the direction of the detection axis.

An electronic device according to the invention incorporates any of the above-described current sensors.

With the invention, the user of the current sensor can customize the current sensor by selecting a combination of a structure of busbar and a type of magnetic sensor.

DETAILED DESCRIPTION OF THE EXEMPLARY EMBODIMENTS

Figure 1:
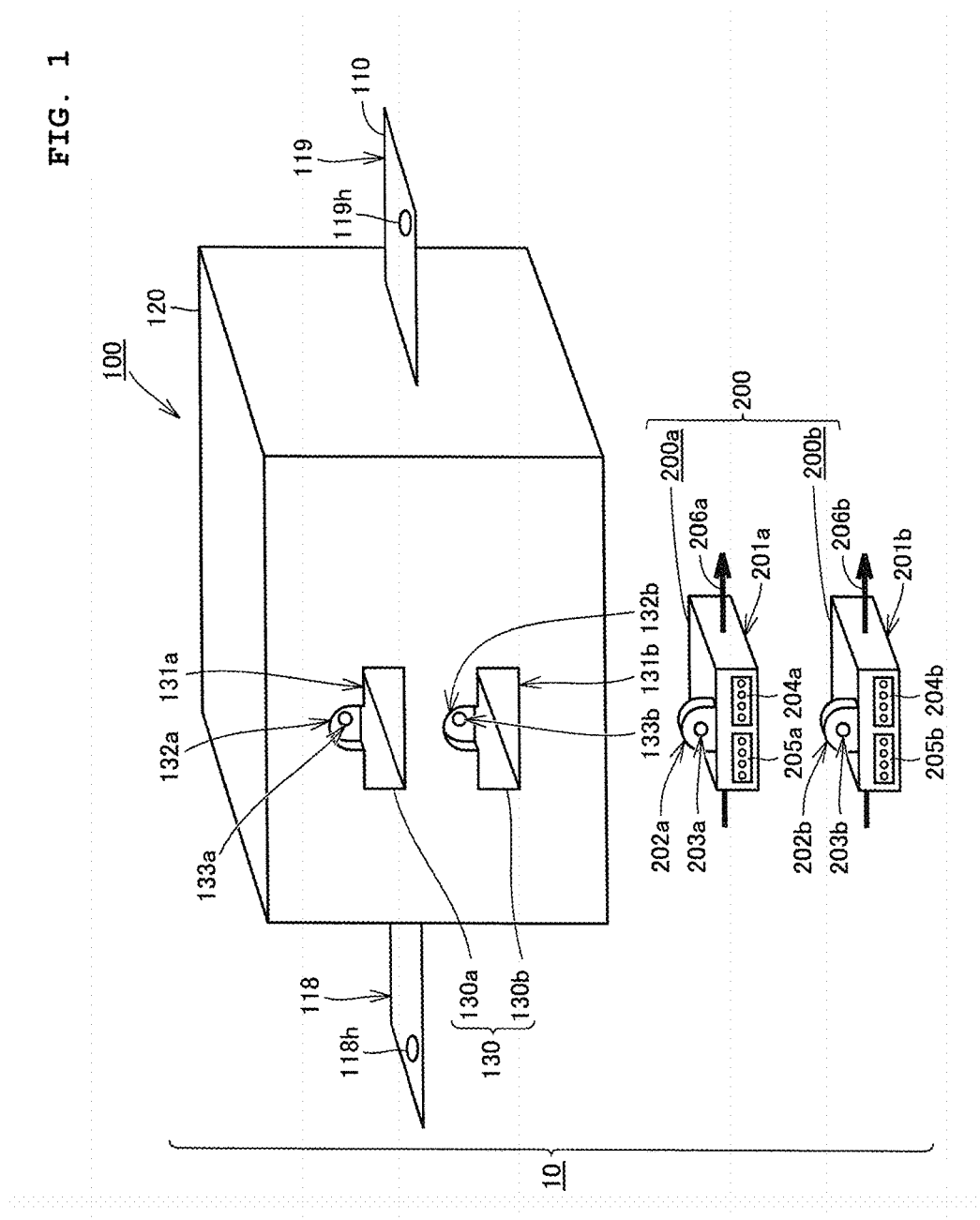
FIG. 1 is an exploded perspective view showing a configuration of a current sensor according to a first embodiment of the invention.

A current sensor according to a first embodiment of the invention is described below with reference to the drawings. In the following description, the same reference sign is applied to the same or corresponding portion in the drawings, and the redundant description is omitted.

First Embodiment

FIG. 1 is an exploded perspective view showing a configuration of a current sensor according to the first embodiment of the invention. As shown in FIG. 1, a current sensor 10 according to the first embodiment of the invention includes a busbar module 100 and a magnetic sensor module 200. The busbar module 100 includes a busbar 110 through which current of a measurement subject flows, and a hold portion 120 that holds the busbar 110 and has a recess portion 130. The busbar 110 and the hold portion 120 are integrally formed. The magnetic sensor module 200 includes a magnetic sensor that detects the intensity of a magnetic field generated by the current of the measurement subject flowing through the busbar 110, and is able to be selectively assembled with the busbar module 100 by housing the magnetic sensor module 200 in the recess portion 130 of the hold portion 120.

Respective configurations are described in detail below.

Figure 2:
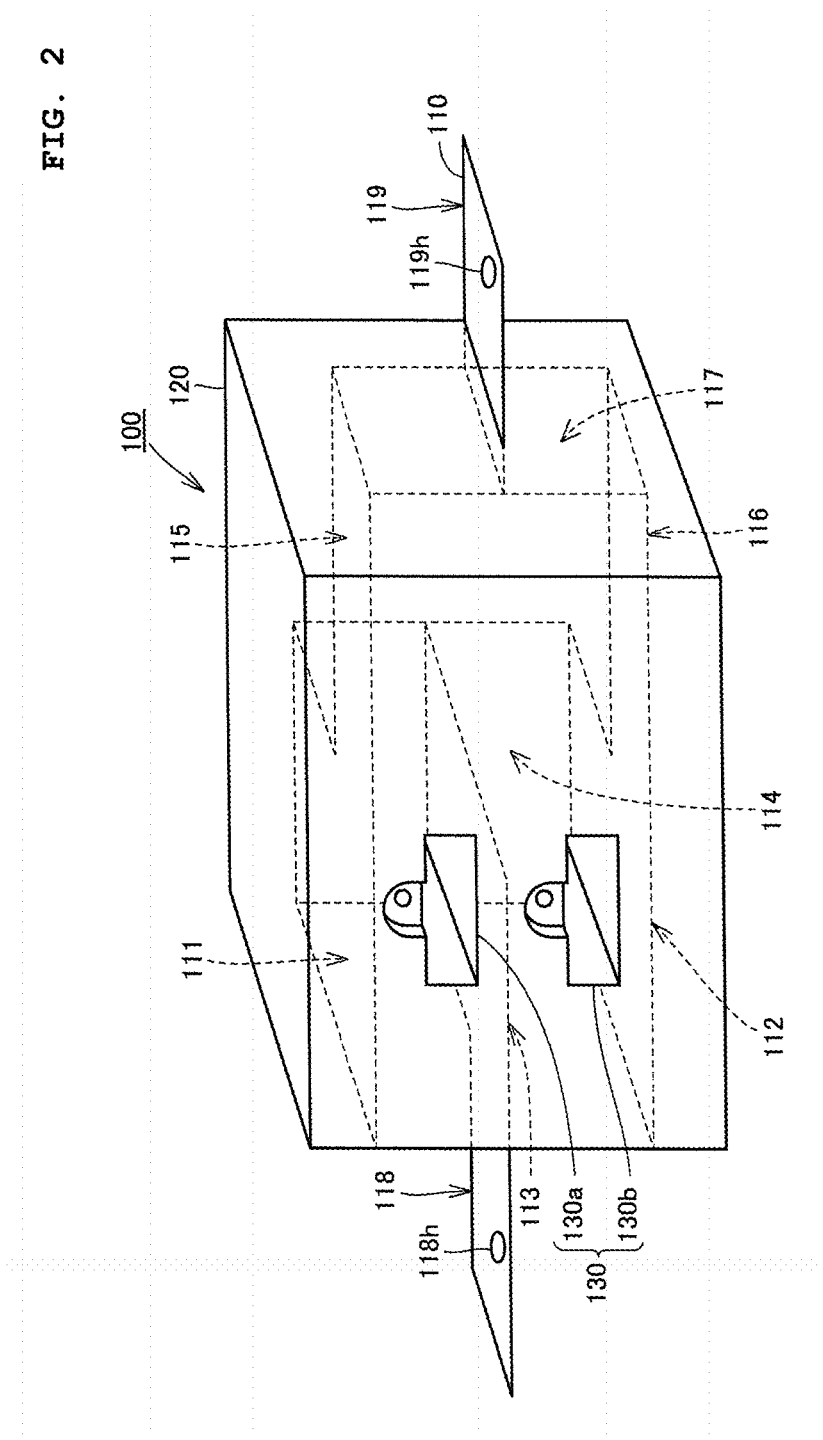
FIG. 2 is a perspective view showing a configuration of a busbar module according to the first embodiment of the invention.
Figure 3:
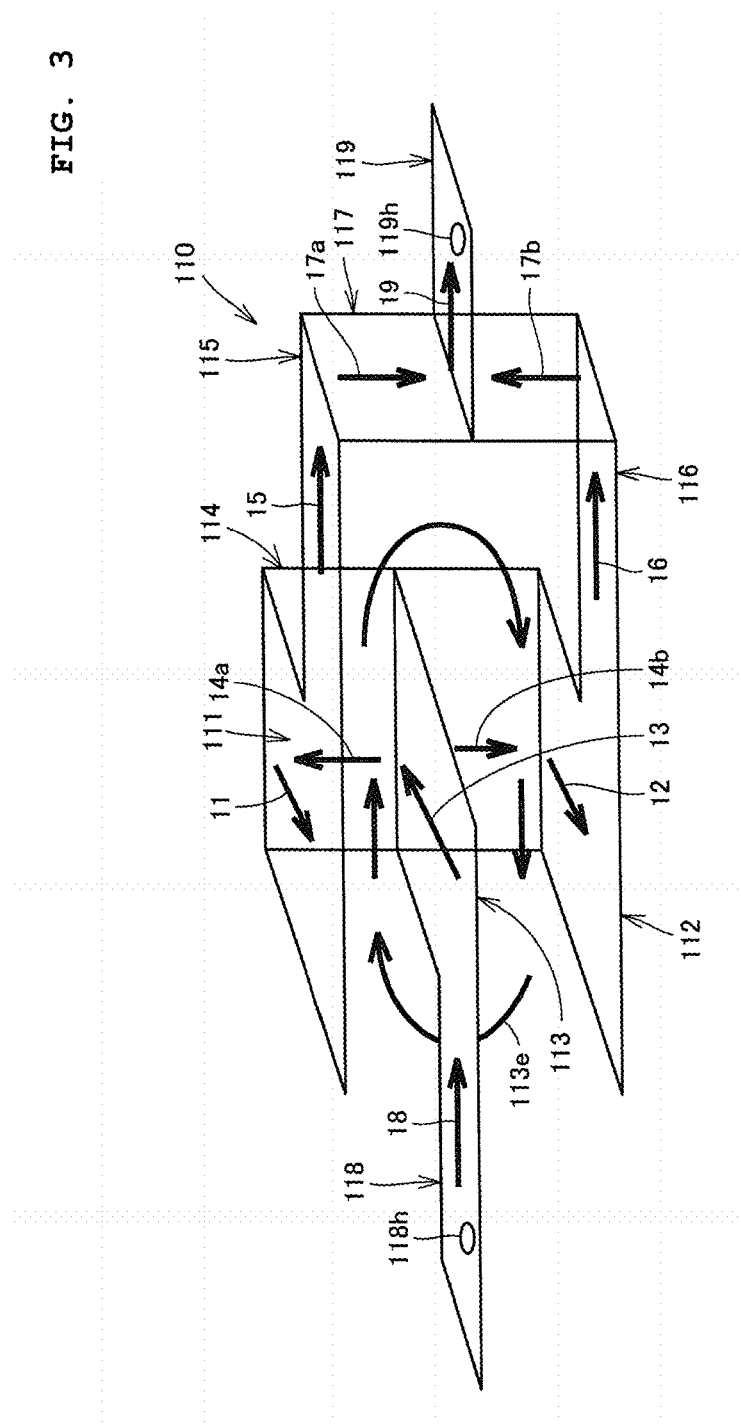
FIG. 3 is a perspective view showing a structure of a busbar according to the first embodiment of the invention.

FIG. 2 is a perspective view showing a configuration of the busbar module 100 according to this embodiment. FIG. 3 is a perspective view showing a structure of the busbar 110 according to this embodiment.

As shown in FIGS. 1 to 3, in the busbar module 100 according to this embodiment, the busbar 110 includes a first busbar portion 111 and a second busbar portion 112 connected electrically in parallel to each other and extending in parallel to each other with a gap interposed therebetween. The busbar 110 further includes a third busbar portion 113 arranged at an intermediate position between the first busbar portion 111 and the second busbar portion 112 and extending in parallel to each of the first busbar portion 111 and the second busbar portion 112 with a gap interposed therebetween.

In this embodiment, the first busbar portion 111, the second busbar portion 112, and the third busbar portion 113 are arranged at regular intervals. An end portion of the first busbar portion 111, an end portion of the second busbar portion 112, and an end portion of the third busbar portion 113 are coupled to each other by a first coupling portion 114.

The first coupling portion 114 extends in a direction in which the first busbar portion 111, the second busbar portion 112, and the third busbar portion 113 are arranged. That is, the first coupling portion 114 is orthogonal to each of the first busbar portion 111, the second busbar portion 112, and the third busbar portion 113.

The first busbar portion 111 is provided with a first extension portion 115 extending rightward in FIGS. 1 to 3. The second busbar portion 112 is provided with a second extension portion 116 extending rightward in FIGS. 1 to 3.

An end portion of the first extension portion 115 and an end portion of the second extension portion 116 are coupled to each other by a second coupling portion 117. The second coupling portion 117 extends in a direction in which the first busbar portion 111 and the second busbar portion 112 are arranged. That is, the second coupling portion 117 is orthogonal to each of the first busbar portion 111 and the second busbar portion 112.

Further, the busbar 110 includes an input terminal portion 118 for inputting current to the busbar 110, and an output terminal portion 119 for outputting the current from the busbar 110. The input terminal portion 118 and the output terminal portion 119 are located in the same plane, and extend in mutually opposite directions in a direction of a detection axis of a magnetic sensor (described later).

To be specific, the input terminal portion 118 extends leftward in FIGS. 1 to 3, and the output terminal portion 119 extends rightward in FIGS. 1 to 3. The input terminal portion 118 is connected to an end portion of the third busbar portion 113. The output terminal portion 119 is connected to a center portion of the second coupling portion 117. The input terminal portion 118 has a first through hole 118h in an end portion thereof. The output terminal portion 119 has a second through hole 119h in an end portion thereof.

The first through hole 118h is a hole for connecting input wiring. The second through hole 119h is a hole for connecting output wiring. However, the first through hole 118h may be used for connecting the output wiring, and the second through hole 119h may be used for connecting the input wiring.

In this embodiment, the busbar 110 is formed of oxygen-free copper. However, the material of the busbar 110 is not limited thereto, and may be one of metals, such as aluminum, silver, and copper, or an alloy containing such a metal.

Also, surface processing may be applied to the busbar 110. For example, at least one plated layer made of one of metals, such as nickel, tin, silver, and copper, or an alloy containing such a metal may be provided on the surface of the busbar 110.

In this embodiment, the busbar 110 is formed by pressing thin plates and welding the thin plates to each other. However, the formation method of the busbar 110 is not limited thereto. The busbar 110 may be formed by a method such as cutting or casting.

As shown in FIG. 3, in the busbar 110, current input to the input terminal portion 118 flows rightward as indicated by an arrow 18, and then flows through the third busbar portion 113 rearward of the paper face as indicated by an arrow 13.

Part of the current diverted at the first coupling portion 114 flows through the first coupling portion 114 upward as indicated by an arrow 14a. The residual part of the current diverted at the first coupling portion 114 flows through the first coupling portion 114 downward as indicated by an arrow 14b.

That is, in the first coupling portion 114, the direction 14a in which the current flows through a portion located at the first busbar portion 111 side with respect to the third busbar portion 113 is opposite to the direction 14b in which the current flows through a portion located at the second busbar portion 112 side with respect to the third busbar portion 113.

The current flowing from the first coupling portion 114 into the first busbar portion 111 flows through the first busbar portion 111 forward of the paper face as indicated by an arrow 11, and then flows through the first extension portion 115 rightward as indicated by an arrow 15. Then, the current flowing from the first busbar portion 111 into the second coupling portion 117 flows through the second coupling portion 117 downward as indicated by an arrow 17a.

The current flowing from the first coupling portion 114 into the second busbar portion 112 flows through the second busbar portion 112 forward of the paper face as indicated by an arrow 12, and then flows through the second extension portion 116 rightward as indicated by an arrow 16. Then, the current flowing from the second busbar portion 112 into the second coupling portion 117 flows through the second coupling portion 117 upward as indicated by an arrow 17b.

That is, in the second coupling portion 117, the direction 17a in which the current flows through a portion located at the first busbar portion 111 side with respect to a center portion is opposite to the direction 17b in which the current flows through a portion located at the second busbar portion 112 side with respect to the center portion.

The current joined at the second coupling portion 117 and flowing into the output terminal portion 119 flows through the output terminal portion 119 rightward as indicated by an arrow 19, and then the current is output from the output terminal portion 119.

Since the current flows through the first busbar portion 111, the second busbar portion 112, and the third busbar portion 113 as described above, a magnetic field 113e circulating in the right direction (clockwise) in the drawing around the third busbar portion 113 is generated according to so-called right-handed screw rule as shown in FIG. 3.

As shown in FIGS. 1 and 2, the hold portion 120 has a substantially rectangular-parallelepiped-like outer shape. However, the outer shape of the hold portion 120 is not limited to the rectangular-parallelepiped-like shape, and may be, for example, a spherical shape or a columnar shape.

In this embodiment, the hold portion 120 is formed of a resin material having electrically insulating properties. To be specific, the hold portion 120 is preferably formed of thermoplastic resin or thermosetting resin, and is preferably formed by insert molding with the busbar 110 using acrylonitrile butadiene styrene (ABS) resin, polyphenylene sulfide (PPS) resin, liquid crystal polymer (LCP), polybutylene terephthalate (PBT) resin, or the like, as a material.

By using such a material, the hold portion 120 having high resistance to heat and high resistance to humidity, and having a stable shape and stable dimensions can be formed. However, the material of the hold portion 120 is not limited to the resin material, and may use, for example, rubber.

As shown in FIGS. 1 and 2, the input terminal portion 118 protrudes from the left side surface of the hold portion 120, and the output terminal portion 119 protrudes from the right side surface of the hold portion 120. Two recess portions 130 are provided at the front surface of the hold portion 120. The recess portions 130 each are located between the mutually neighboring busbars.

To be specific, the busbar module 100 has, as the recess portions 130, a first recess portion 130a located between the first busbar portion 111 and the third busbar portion 113, and a second recess portion 130b located between the second busbar portion 112 and the third busbar portion 113.

In this embodiment, the recess portions 130 each have a fitting structure. The fitting structure is a structure that is fitted to the outer shape of the magnetic sensor module 200.

The outer shape of the magnetic sensor module 200 is described now. The magnetic sensor module 200 has the outer shape that has directivity with respect to the recess portion 130 and is fitted to the recess portion 130. Having directivity and being fitted represent that the outer shape of the magnetic sensor module 200 is fitted to the recess portion 130 so that the magnetic sensor module 200 can be housed in the recess portion 130 only when the orientation of the magnetic sensor module 200 with respect to the recess portion 130 is a predetermined orientation.

Hence, the shapes of the magnetic sensor module 200 and the recess portion 130 according to this embodiment are merely an example. The magnetic sensor module 200 and the recess portion 130 may have any shapes as long as both have directivity and are fitted to each other.

As described above, the recess portion 130 is an assembly portion for assembling the magnetic sensor module 200 to the busbar module 100. In this embodiment, the magnetic sensor module 200 is assembled with the busbar module 100 by the recess portion 130 being the assembly portion having the fitting structure. However, the magnetic sensor module 200 may be assembled with the busbar module 100 by other structure.

For example, the recess portion 130 may have a cavity being larger than the outer shape of the magnetic sensor module 200, and the magnetic sensor module 200 may be assembled with the busbar module 100 by fixing the magnetic sensor module 200 to the bottom surface of the recess portion 130 by a screw or the like so that the magnetic sensor module 200 does not contact the side walls of the recess portion 130.

Figure 4:
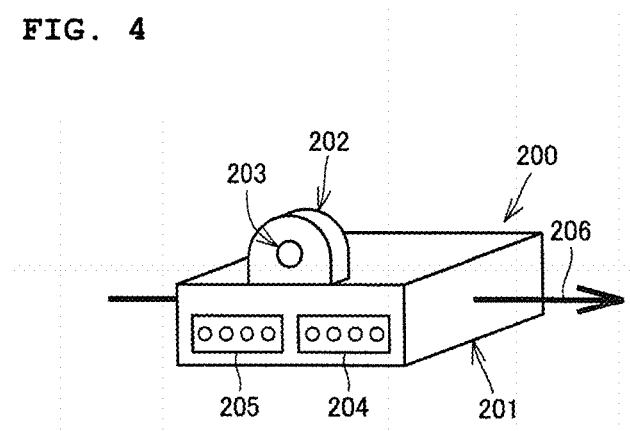
FIG. 4 is a perspective view showing an appearance of a magnetic sensor module according to the first embodiment of the invention.

FIG. 4 is a perspective view showing an appearance of the magnetic sensor module 200 according to this embodiment. As shown in FIG. 4, the magnetic sensor module 200 includes a main body portion 201 having a rectangular-parallelepiped-like outer shape, and a protrusion portion 202 protruding from the upper surface of the main body portion 201 and being a substantially semicircular column. The protrusion portion 202 has a hole portion 203 penetrating therethrough in the front-rear direction of the paper face of FIG. 4.

An input terminal group 204 and an output terminal group 205 of the magnetic sensor module 200 are provided at the front surface of the main body portion 201. In this embodiment, the input terminal group 204 includes four input terminals, and the output terminal group 205 includes four output terminals.

The magnetic sensor module 200 includes a magnetic sensor having a detection axis in a direction indicated by an arrow 206 in FIG. 4. That is, the magnetic sensor has the detection axis in the left-right direction of the main body portion 201.

A magnetic sensor has odd function input/output characteristics and detects the intensity of the magnetic field generated by the current of the measurement subject flowing through the busbar 110 (described later). The magnetic sensor detects the intensity of the magnetic field in the right direction as indicated by the arrow 206 in FIG. 4, as a positive value.

In this embodiment, the current sensor 10 includes a first magnetic sensor module 200a and a second magnetic sensor module 200b being the same as the magnetic sensor module 200. The first magnetic sensor module 200a includes a first magnetic sensor (described later). The second magnetic sensor module 200b includes a second magnetic sensor (described later).

Figure 5:
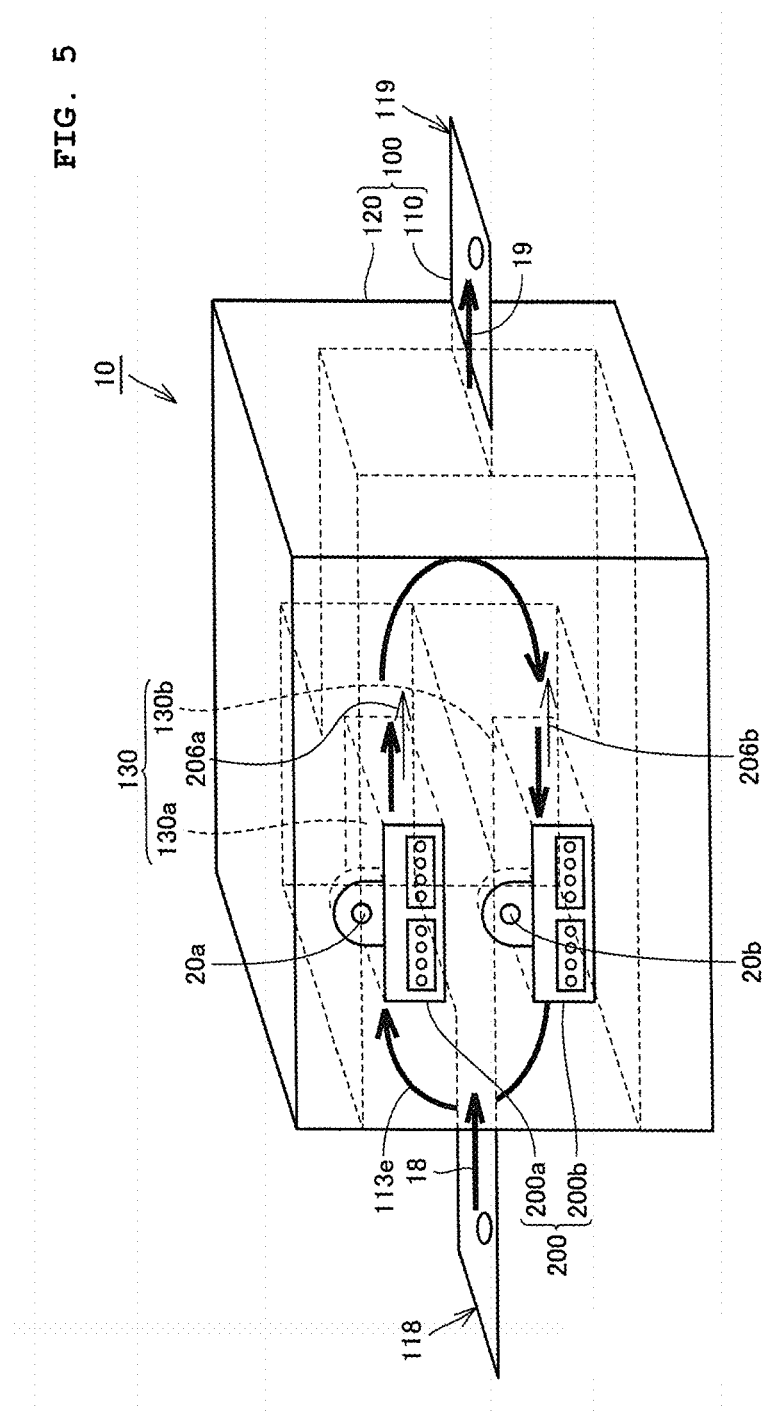
FIG. 5 is a perspective view showing an assembled state of the busbar module and the magnetic sensor module in the current sensor according to the first embodiment of the invention.

FIG. 5 is a perspective view showing an assembled state of the busbar module 100 and the magnetic sensor module 200 in the current sensor 10 according to this embodiment. As shown in FIG. 5, the first magnetic sensor module 200a is housed in the first recess portion 130a, and the second magnetic sensor module 200b is housed in the second recess portion 130b.

As shown in FIGS. 1, 2, and 5, the first recess portion 130a has a main-body recess portion 131a being slightly larger than the outer shape of a main body portion 201a of the first magnetic sensor module 200a. The first recess portion 130a further has an upper recess portion 132a above the main-body recess portion 131a. The upper recess portion 132*a* is slightly larger than the outer shape of a protrusion portion 202*a* of the first magnetic sensor module 200*a*.

An internal thread 133*a* is provided in a wall portion located at a deep position of the upper recess portion 132*a*, at a position corresponding to a hole portion 203*a* of the first magnetic sensor module 200*a*.

The main-body recess portion 131*a* extends in parallel to the first busbar portion 111 and the third busbar portion 113 in front view.

Similarly, the second recess portion 130*b* has a main-body recess portion 131*b* being slightly larger than the outer shape of a main body portion 201*b* of the second magnetic sensor module 200*b*. The second recess portion 130*b* further has an upper recess portion 132*b* above the main-body recess portion 131*b*. The upper recess portion 132*b* is slightly larger than the outer shape of a protrusion portion 202*b* of the second magnetic sensor module 200*b*.

An internal thread 133*b* is provided in a wall portion located at a deep position of the upper recess portion 132*b*, at a position corresponding to a hole portion 203*b* of the second magnetic sensor module 200*b*.

The main-body recess portion 131*b* extends in parallel to the second busbar portion 112 and the third busbar portion 113 in front view.

As shown in FIGS. 1 and 5, the first magnetic sensor module 200*a* is housed in the first recess portion 130*a* such that the main body portion 201*a* is fitted to the main-body recess portion 131*a* and the protrusion portion 202*a* is fitted to the upper recess portion 132*a*. In this state, by inserting a screw 20*a* into the hole portion 203*a* and screwing the screw 20*a* into the internal thread 133*a*, the first magnetic sensor module 200*a* is fixed to the busbar module 100.

Alternatively, without using the screw 20*a*, the first magnetic sensor module 200*a* may be fixed to the busbar module 100 only by a fitting force between the first magnetic sensor module 200*a* and the first recess portion 130*a*.

In a state in which the first magnetic sensor module 200*a* is housed in the first recess portion 130*a*, the first magnetic sensor has a detection axis in a direction indicated by an arrow 206*a* that is a direction orthogonal to an arrangement direction of the first to third busbar portions 111 to 113, and a direction orthogonal to an extending direction of the first to third busbar portions 111 to 113.

The first magnetic sensor has odd function input/output characteristics and detects the intensity of magnetic field as described above. The first magnetic sensor detects the intensity of magnetic field in the right direction as indicated by the arrow 206*a* in FIG. 5, as a positive value.

The second magnetic sensor module 200*b* is housed in the second recess portion 130*b* such that the main body portion 201*b* is fitted to the main-body recess portion 131*b* and the protrusion portion 202*b* is fitted to the upper recess portion 132*b*. In this state, by inserting a screw 20*b* into the hole portion 203*b* and screwing the screw 20*b* into the internal thread 133*b*, the second magnetic sensor module 200*b* is fixed to the busbar module 100.

Alternatively, without using the screw 20*b*, the second magnetic sensor module 200*b* may be fixed to the busbar module 100 only by a fitting force between the second magnetic sensor module 200*b* and the second recess portion 130*b*.

In a state in which the second magnetic sensor module 200*b* is housed in the second recess portion 130*b*, the second magnetic sensor has a detection axis in a direction indicated by an arrow 206*b* that is a direction orthogonal to an arrangement direction of the first to third busbar portions 111 to 113, and a direction orthogonal to an extending direction of the first to third busbar portions 111 to 113.

The second magnetic sensor has odd function input/output characteristics and detects the intensity of magnetic field as described above. The second magnetic sensor detects the intensity of magnetic field in the right direction as indicated by the arrow 206*b* in FIG. 5, as a positive value.

As shown in FIG. 5, the magnetic field 113*e* enters the first magnetic sensor in the right direction in the drawing, and enters the second magnetic sensor in the left direction in the drawing. As the result, regarding the intensity of the magnetic field generated by the current of the measurement subject flowing through the busbar 110, the phase of the detection value of the first magnetic sensor is opposite to the phase of the detection value of the second magnetic sensor. To be specific, the detection value of the first magnetic sensor is a positive value, and the detection value of the second magnetic sensor is a negative value.

The magnetic sensor module 200 further includes calculating means for calculating a value of the current by calculating the detection values of the magnetic sensors. In this embodiment, the calculating means is a subtracter.

Figure 6:
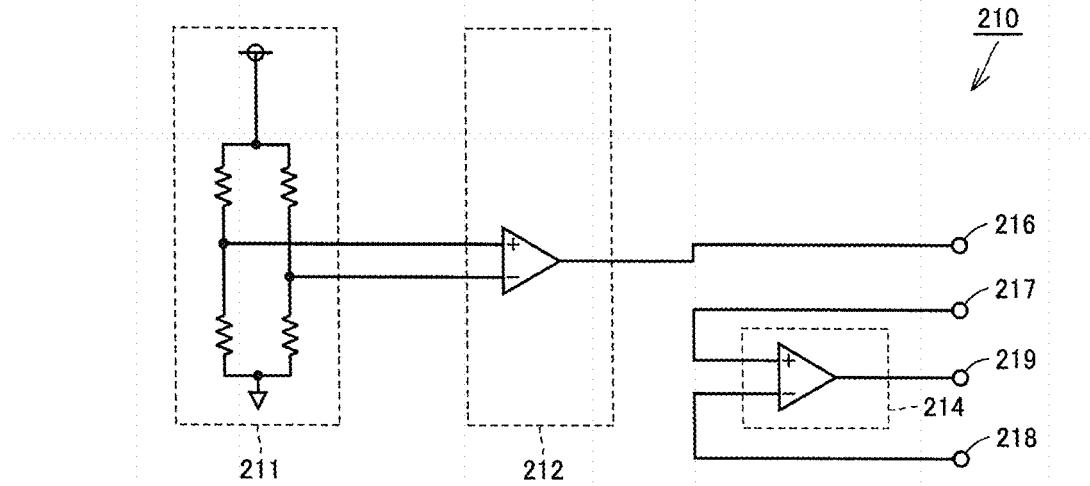
FIG. 6 is a circuit diagram showing a major configuration of a sensor circuit included in the magnetic sensor module in the current sensor according to the first embodiment of the invention.

FIG. 6 is a circuit diagram showing a major configuration of a sensor circuit 210 included in the magnetic sensor module 200 in the current sensor 10 according to this embodiment. As shown in FIG. 6, the sensor circuit 210 included in the magnetic sensor module 200 according to this embodiment includes a magnetic sensor 211, an amplifier 212, and a subtracter 214.

The magnetic sensor 211 is connected to the input side of the amplifier 212. A sensor output terminal 216 is connected to the output side of the amplifier 212.

An addition input terminal 217 and a subtraction input terminal 218 are connected to the input side of the subtracter 214. A subtraction output terminal 219 is connected to the output side of the subtracter 214.

The magnetic sensor 211 converts an input magnetic field into an output voltage. The magnetic sensor 211 according to this embodiment forms a Wheatstone-bridge-type bridge circuit. The output voltage is a differential output, that is, a balanced output.

The amplifier 212 amplifies the output voltage. Hence, a differential amplifier is suitable for the amplifier 212. In this embodiment, an operational amplifier is used. As the subtracter 214, a differential amplifier is used.

The magnetic sensor module 200 according to this embodiment performs closed-loop-type magnetic-field measurement without an exciting coil portion (described later).

Figure 7:
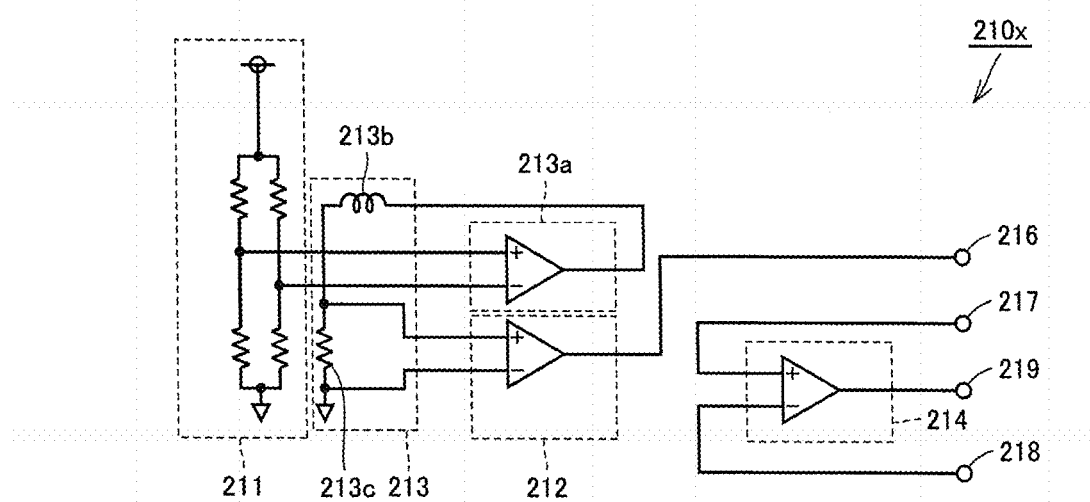
FIG. 7 is a circuit diagram showing a major configuration of a sensor circuit included in a magnetic sensor module in a current sensor according to a first modification of the first embodiment of the invention.

However, closed-loop-type magnetic-field measurement with an exciting coil portion may be performed. FIG. 7 is a circuit diagram showing a major configuration of a sensor circuit 210*x* included in a magnetic sensor module in a current sensor according to a first modification of this embodiment.

As shown in FIG. 7, the sensor circuit 210*x* included in the magnetic sensor module according to the first modification of this embodiment includes the magnetic sensor 211, an exciting coil portion 213, an exciting coil driver 213*a*, the amplifier 212, and the subtracter 214.

The magnetic sensor 211 is connected to the input side of the exciting coil driver 213*a*. The exciting coil portion 213 is connected to the output side of the exciting coil driver 213*a*. The exciting coil portion 213 is connected to the input side of the amplifier 212. The sensor output terminal 216 is connected to the output side of the amplifier 212.

The addition input terminal 217 and the subtraction input terminal 218 are connected to the input side of the subtracter 214. The subtraction output terminal 219 is connected to the output side of the subtracter 214.

As the exciting coil driver 213a, a differential amplifier is used. The exciting coil portion 213 includes an exciting coil 213b and a current detection resistor 213c.

As described above, the magnetic sensor module according to the first modification includes the sensor circuit 210x having a closed loop of the exciting coil 213b.

In the sensor circuit 210x according to the first modification, driving current is supplied to the exciting coil portion 213 from the exciting coil driver 213a. A magnetic field that is generated when the driving current flows through the exciting coil 213b is applied to the magnetic sensor 211. The magnetic field 113e that is generated by the current of the measurement subject flowing through the busbar 110 is also applied to the magnetic sensor 211. Hence, the magnetic field generated from the exciting coil 213b and the magnetic field 113e are applied in a superposed manner to the magnetic sensor 211.

The intensity of the magnetic field applied in a superposed manner to the magnetic sensor 211 as described above is a value in which the intensities of the magnetic fields are superimposed according to so-called theory of superposition. The exciting coil driver 213a supplies the driving current to the exciting coil portion 213 so that the intensity of the magnetic field applied in a superposed manner to the magnetic sensor 211 becomes 0 by the action of negative feedback. By measuring the driving current at this time by the current detection resistor 213c and the amplifier 212, the intensity of the magnetic field 113e can be indirectly detected.

As described above, in the sensor circuit 210x according to the first modification, since the measurement is performed while the magnetic field with the constant intensity (substantially 0) is applied to the magnetic sensor 211, the influence of the non-linearity of input-output characteristics (the relationship between the input magnetic field and the output voltage) of the magnetic sensor 211 on the linearity of the measurement result can be decreased.

Described next is connection between a first sensor circuit 210a of the first magnetic sensor module 200a and a second sensor circuit 210b of the second magnetic sensor module 200b.

Figure 8:
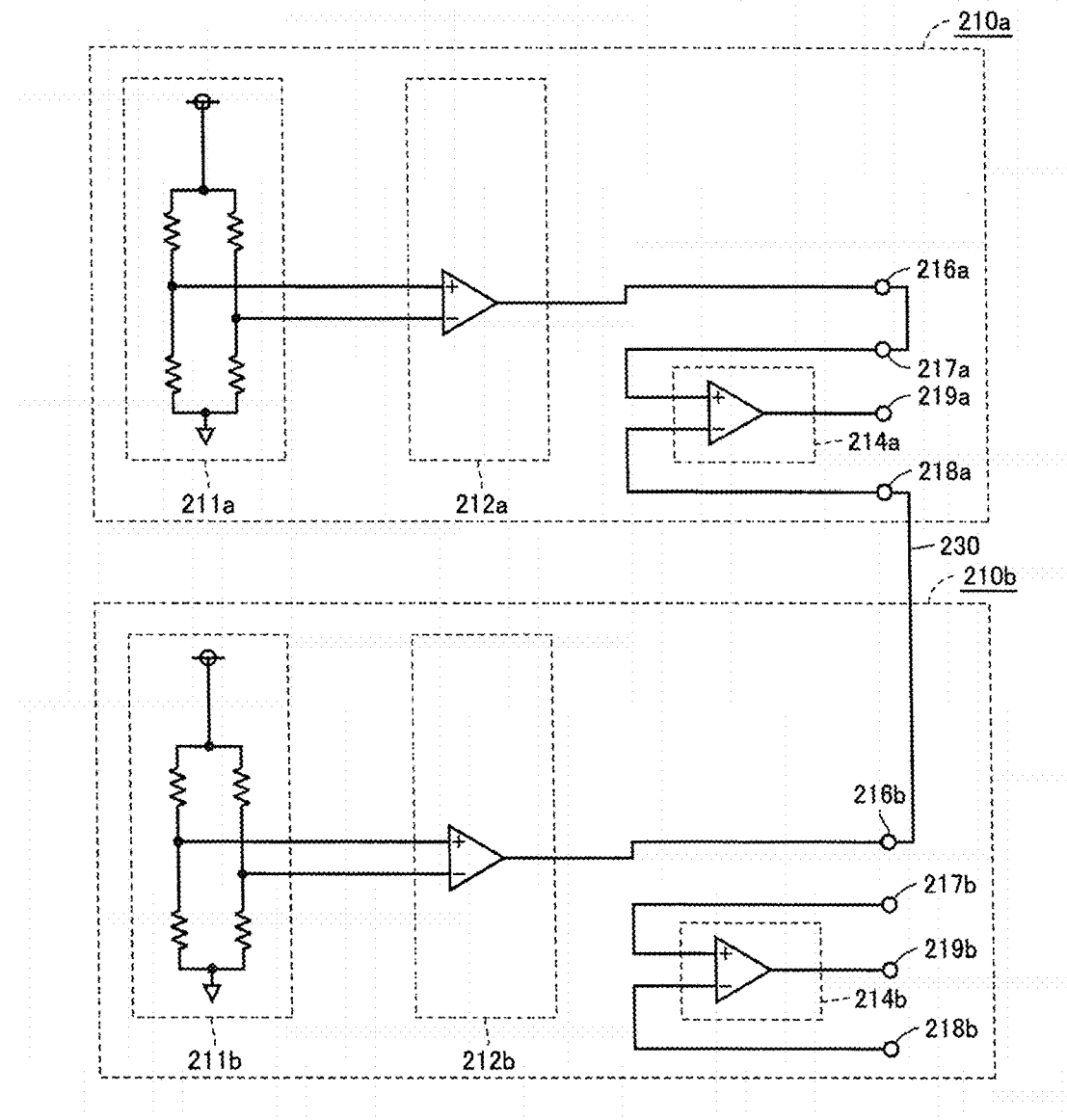
FIG. 8 is a circuit diagram showing connection of major configurations of sensor circuits included in first and second magnetic sensor modules in the current sensor according to the first embodiment of the invention.

FIG. 8 is a circuit diagram showing connection of major configurations of the sensor circuits 210a and 210b included in the first and second magnetic sensor modules 200a and 200b in the current sensor according to this embodiment.

As shown in FIG. 8, in the first magnetic sensor module 200a, a first magnetic sensor 211a, a first amplifier 212a, a first sensor output terminal 216a, a first addition input terminal 217a, a first subtracter 214a, and a first subtraction output terminal 219a are connected in that order.

In the second magnetic sensor module 200b, a second magnetic sensor 211b, a second amplifier 212b, and a second sensor output terminal 216b are connected in that order. The second sensor output terminal 216b is connected to a first subtraction input terminal 218a through external wiring 230.

As described above, the detection value of the first magnetic sensor 211a is a positive value, and the detection value of the second magnetic sensor 211b is a negative value. Hence, the first subtracter 214a executes subtraction on the detection value of the first magnetic sensor 211a and the detection value of the second magnetic sensor 211b. As the result, the absolute value of the detection value of the first magnetic sensor 211a and the absolute value of the detection value of the second magnetic sensor 211b are added, and the addition result is output to the first subtraction output terminal 219a.

As shown in FIG. 8, if the first sensor circuit 210a is connected to the second sensor circuit 210b, a second subtracter 214b of the second magnetic sensor module 200b is not used.

Figure 9:
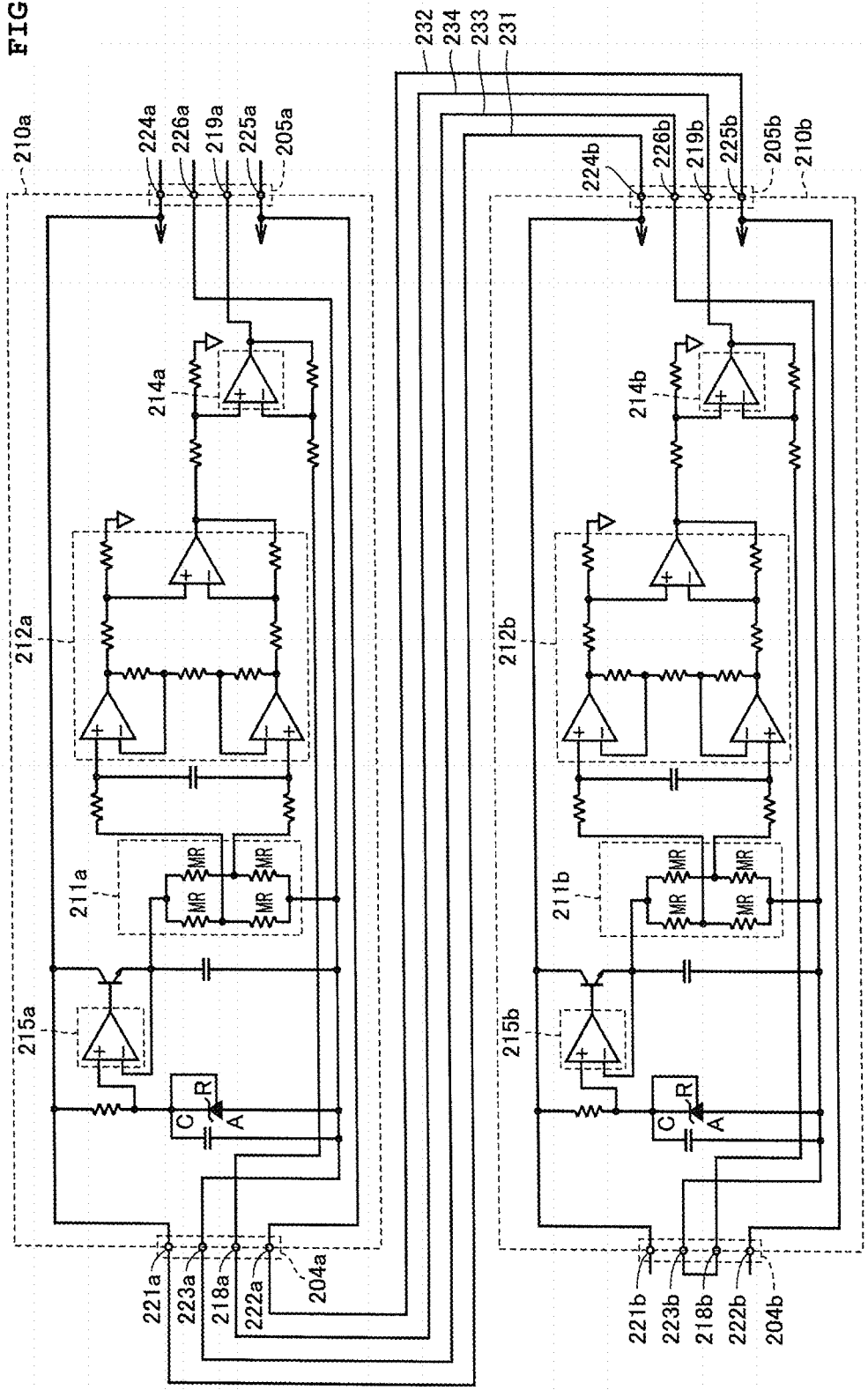
FIG. 9 is a circuit diagram showing connection of specific configurations of the sensor circuits included in the first and second magnetic sensor modules in the current sensor according to the first embodiment of the invention.

FIG. 9 is a circuit diagram showing connection of specific configurations of the sensor circuits 210a and 210b of the first and second magnetic sensor modules 200a and 200b in the current sensor according to this embodiment.

As shown in FIG. 9, the first sensor circuit 210a of the first magnetic sensor module 200a includes a first sensor driver 215a, the first magnetic sensor 211a, the first amplifier 212a, and the first subtracter 214a.

Also, the first sensor circuit 210a of the first magnetic sensor module 200a includes a first positive supply input terminal 221a, a first ground input terminal 223a, the first subtraction input terminal 218a, and a first negative supply input terminal 222a included in a first input terminal group 204a.

Further, the first sensor circuit 210a of the first magnetic sensor module 200a includes a first positive supply output terminal 224a, a first ground output terminal 226a, the first subtraction output terminal 219a, and a first negative supply output terminal 225a included in a first output terminal group 205a.

The second sensor circuit 210b of the second magnetic sensor module 200b includes a second sensor driver 215b, the second magnetic sensor 211b, the second amplifier 212b, and the second subtracter 214b.

Also, the second sensor circuit 210b of the second magnetic sensor module 200b includes a second positive supply input terminal 221b, a second ground input terminal 223b, a second subtraction input terminal 218b, and a second negative supply input terminal 222b included in a second input terminal group 204b.

Further, the second sensor circuit 210b of the second magnetic sensor module 200b includes a second positive supply output terminal 224b, a second ground output terminal 226b, a second subtraction output terminal 219b, and a second negative supply output terminal 225b included in a second output terminal group 205b.

The first positive supply input terminal 221a and the second positive supply output terminal 224b are connected by external wiring 231. The first ground input terminal 223a and the second ground output terminal 226b are connected by external wiring 233. The first subtraction input terminal 218a and the second subtraction output terminal 219b are connected by external wiring 234. The first negative supply input terminal 222a and the second negative supply output terminal 225b are connected by external wiring 232.

In this embodiment, the two magnetic sensor modules having the separate configurations respectively have the magnetic sensors. However, the configuration of the magnetic sensor module is not limited thereto. A single magnetic sensor module may include a plurality of magnetic sensors.

Figure 10:
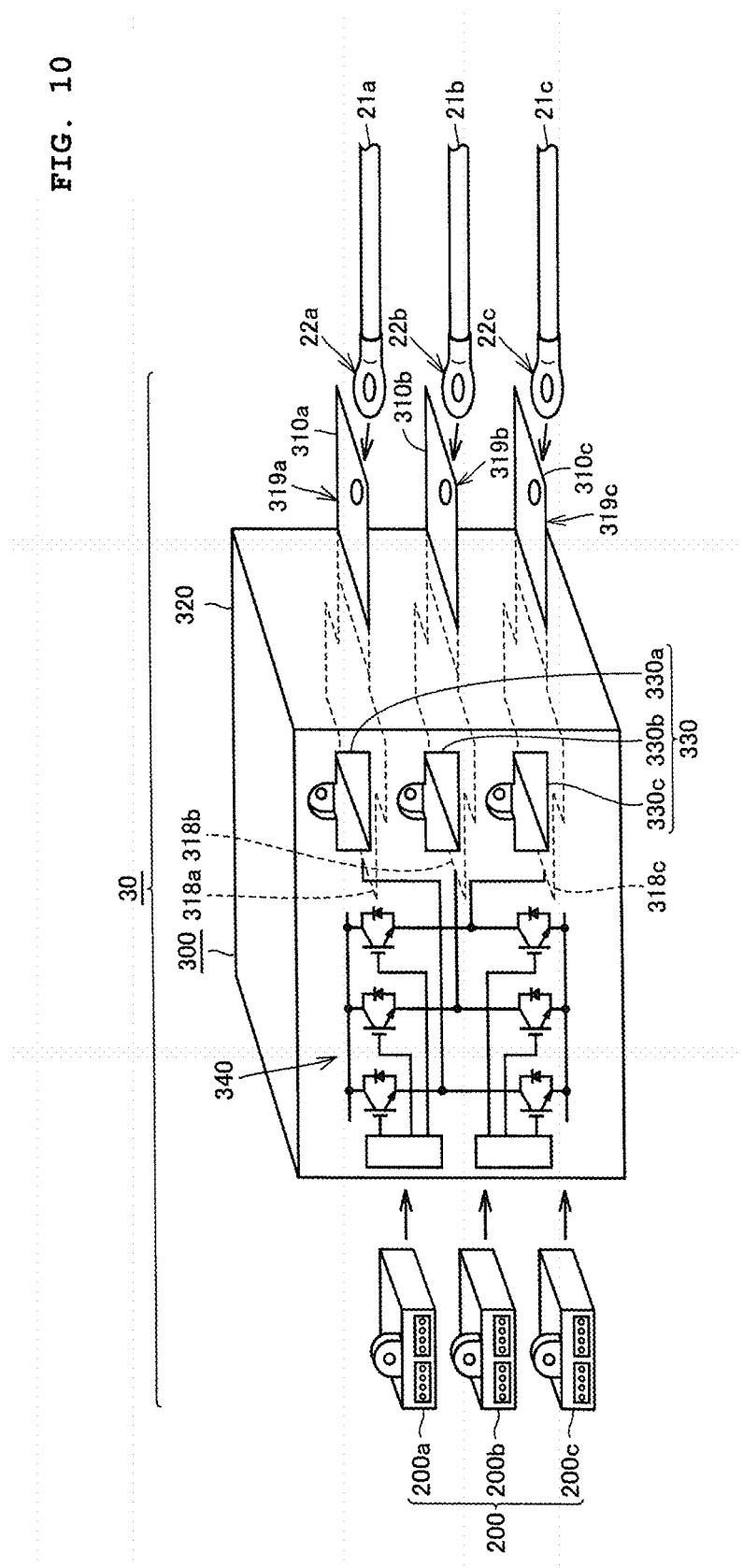
FIG. 10 is an exploded perspective view showing a configuration of a current sensor according to a second modification of the first embodiment of the invention.

Also, a busbar module may be integrally formed with an electrical device such as an inverter or a converter. FIG. 10 is an exploded perspective view showing a configuration of a current sensor 30 according to a second modification of this embodiment. In FIG. 10, the structures of busbars, recess portions, and electrical devices are illustrated in a simple manner.

As shown in FIG. 10, the current sensor 30 according to the second modification of this embodiment includes a busbar module 300 and the magnetic sensor module 200.

The busbar module 300 includes a first busbar 310a, a second busbar 310b, and a third busbar 310c. Also, the busbar module 300 includes a hold portion 320 that holds the first busbar 310a, the second busbar 310b, and the third busbar 310c and that has a recess portion 330.

Further, the busbar module 300 includes an inverter 340 that is an electrical device held by the hold portion 320 together with the first busbar 310a, the second busbar 310b, and the third busbar 310c while the inverter 340 is connected to each of the first busbar 310a, the second busbar 310b, and the third busbar 310c.

To be specific, the inverter 340 has three-phase outputs. The inverter 340 includes an active element, such as IGBT (Insulated Gate Bipolar Transistor) or FET (Field effect transistor), and includes a collector, an emitter, a drain, a source, etc., being an output electrode of the active element.

The first-phase output electrode of the inverter 340 is connected to a first input terminal portion 318a of the first busbar 310a by wire bonding or soldering. Similarly, the second-phase output electrode of the inverter 340 is connected to a second input terminal portion 318b of the second busbar 310b. The third-phase output electrode of the inverter 340 is connected to a third input terminal portion 318c of the third busbar 310c.

A first output terminal portion 319a of the first busbar 310a protrudes from the hold portion 320, and is fastened to, for example, an end terminal 22a of a first wire harness 21a connected to the armature of a motor by a bolt and a nut.

Similarly, a second output terminal portion 319b of the second busbar 310b protrudes from the hold portion 320, and is fastened to, for example, an end terminal 22b of a second wire harness 21b connected to the armature of a motor by a bolt and a nut.

A third output terminal portion 319c of the third busbar 310c protrudes from the hold portion 320, and is fastened to, for example, an end terminal 22c of a third wire harness 21c connected to the armature of a motor by a bolt and a nut.

The hold portion 320 has a first recess portion 330a located near the first busbar 310a, a second recess portion 330b located near the second busbar 310b, and a third recess portion 330c located near the third busbar 310c.

A first magnetic sensor module 200a is housed in the first recess portion 330a and assembled with the busbar module 300. A second magnetic sensor module 200b is housed in the second recess portion 330b and assembled with the busbar module 300. A third magnetic sensor module 200c is housed in the third recess portion 330c and assembled with the busbar module 300.

As described above, since the busbar module 300 includes the inverter 340 that is held by the hold portion 320 together with the first to third busbars 310a to 310c while the inverter 340 is connected to the first to third busbars 310a to 310c, it is not required to fasten the first to third busbars 310a to 310c to the output electrode of the inverter 340 by bolts and nuts.

In a case in which the inverter 340 is a power inverter that can handle large power, if a fastening portion including a bolt and a nut is present at the output electrode of the inverter 340, a loss may be generated due to contact resistance or the like of the fastening portion. Hence, in the current sensor 30 according to the second modification of this embodiment, by decreasing the number of fastening portions each including the bolt and the nut at the output electrode of the inverter 340, the loss can be decreased and the efficiency of the current sensor 30 can be increased.

As described above, in the current sensor according to any of this embodiment and the modifications, since the busbar module and the magnetic sensor module are the separate configurations, the user of the current sensor can customize the current sensor by selecting a combination of a structure of busbar and a type of magnetic sensor.

That is, the user of the current sensor can change the structure of the busbar module, and by assembling the magnetic sensor module suitable for the structure of the busbar module after the change with the busbar module, the user can obtain the customized current sensor.

Also, since the current sensor can be formed by merely assembling the magnetic sensor module to the recess portion of the busbar module, versatility of the current sensor can be increased and assembly of the current sensor can be simplified.

Further, the recess portion of the hold portion and the magnetic sensor module have the structures that are fitted to each other with the directivity, an error of the assembly direction of the magnetic sensor module to the recess portion can be prevented. Accordingly, an operation defect of the current sensor can be restricted. However, this fitting structure does not have to be provided.

Also, since the busbar module is manufactured by insert molding, a large amount of busbar modules with the same shape can be easily obtained. Consequently, the positional relationship between the busbar and the magnetic sensor can become stable, and hence the current sensor can be formed to have uniform performance and quality. However, the manufacturing method of the busbar module is not limited to insertion molding, and the manufacturing method may be immersion or the like.

A current sensor according to a second embodiment of the invention is described below. The current sensor according to this embodiment differs from the current sensor 10 according to the first embodiment mainly in the structure of a busbar. Therefore, the description of the other configuration will not be repeated.

Second Embodiment

Figure 11:
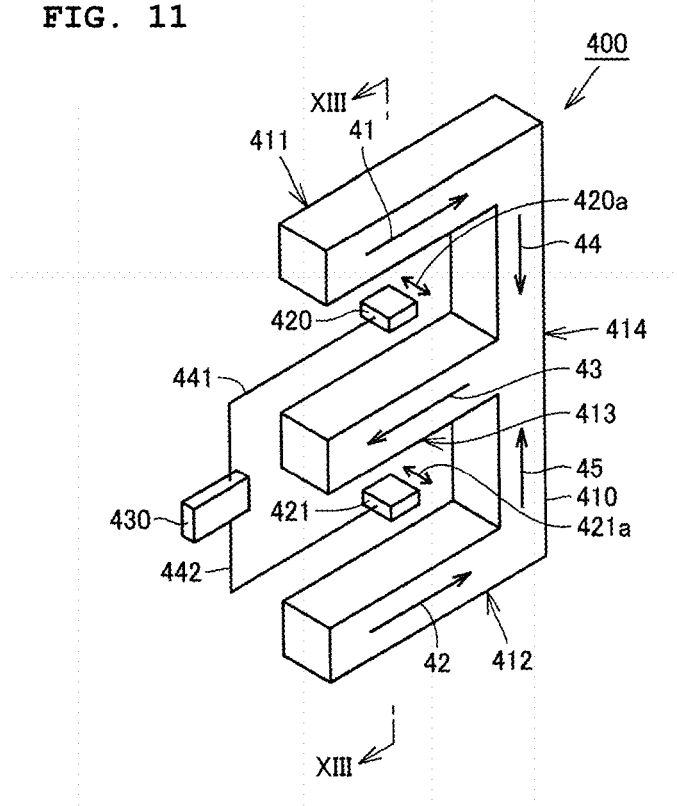
FIG. 11 is a perspective view showing a portion of a configuration of a current sensor according to a second embodiment of the invention.
Figure 12:
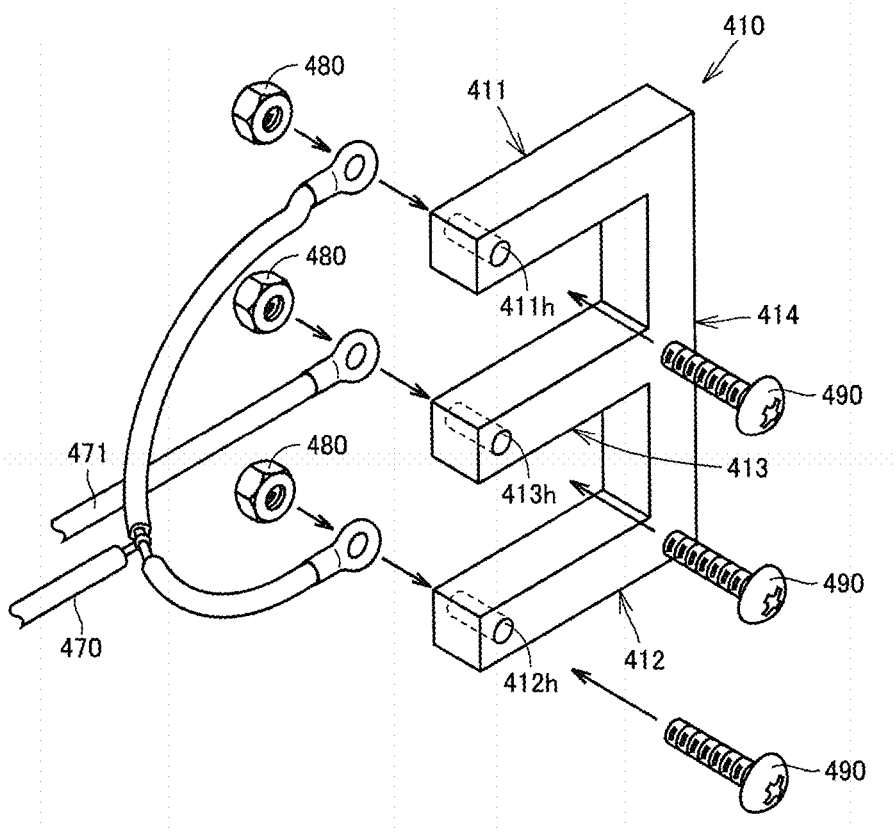
FIG. 12 is a perspective view showing a connection state of a busbar of the current sensor according to the second embodiment of the invention and external wiring.

FIG. 11 is a perspective view showing a portion of a configuration of the current sensor according to the second embodiment of the invention. FIG. 12 is a perspective view showing a connection state of a busbar of the current sensor according to this embodiment and external wiring. FIG. 11 or 12 does not illustrate a hold portion.

As shown in FIG. 11, a current sensor 400 according to the second embodiment of the invention includes a busbar 410 through which current of a measurement subject flows. Also, the current sensor 400 includes a first magnetic sensor 420 and a second magnetic sensor 421 that each have odd function input/output characteristics and detect the intensity of a magnetic field generated by the current of the measurement subject flowing through the busbar 410.

Further, the current sensor 400 includes a subtracter 430 serving as calculating means for calculating a value of the current by executing subtraction on the respective detection values of the first magnetic sensor 420 and the second magnetic sensor 421.

Respective configurations are described in detail below.

The busbar 410 includes a first busbar portion 411 and a second busbar portion 412 connected in electrically parallel to each other and located in parallel to each other with a gap interposed therebetween. The busbar 410 further includes a third busbar portion 413 arranged at an intermediate position between the first busbar portion 411 and the second busbar portion 412 and extending in parallel to each of the first busbar portion 411 and the second busbar portion 412 with a gap interposed therebetween.

In this embodiment, the first busbar portion 411, the second busbar portion 412, and the third busbar portion 413 have rectangular-parallelepiped-like shapes and are arranged at regular intervals. One end in the longitudinal direction of the first busbar portion 411, one end in the longitudinal direction of the second busbar portion 412, and one end in the longitudinal direction of the third busbar portion 413 are connected to each other by a first coupling portion 414.

The first coupling portion 414 has a rectangular-parallelepiped-like shape and extends in a direction in which the first busbar portion 411, the second busbar portion 412, and the third busbar portion 413 are arranged. That is, the first coupling portion 414 is orthogonal to each of the first busbar portion 411, the second busbar portion 412, and the third busbar portion 413.

The shapes of the first busbar portion 411, the second busbar portion 412, the third busbar portion 413, and the first coupling portion 414 are not limited to the rectangular-parallelepiped-like shapes, and may be, for example, columnar shapes.

As described above, the busbar 410 has an E-like shape in plan view. However, the shape of the busbar 410 is not limited thereto, and may at least include the first busbar portion 411, the second busbar portion 412, and the third busbar portion 413.

In this embodiment, the busbar 410 is formed of aluminum. However, the material of the busbar 410 is not limited thereto, and may be one of metals, such as silver and copper, or an alloy containing such a metal.

Also, surface processing may be applied to the busbar 410. For example, at least one plated layer made of one of metals, such as nickel, tin, silver, and copper, or an alloy containing such a metal may be provided on the surface of the busbar 410.

In this embodiment, the busbar 410 is formed by pressing a thin plate. However, the formation method of the busbar 410 is not limited thereto. The busbar 410 may be formed by a method such as cutting or casting.

A direction 41 in which current flows through the first busbar portion 411 is the same as a direction 42 in which current flows through the second busbar portion 412. The direction 41 in which current flows through the first busbar portion 411 and the direction 42 in which current flows through the second busbar portion 412 are opposite to a direction 43 in which current flows through the third busbar portion 413.

As shown in FIG. 12, by connecting the busbar 410 and external wiring, current flows in the above-described directions. The external wiring includes input wiring 470 divided into two input terminals, and output wiring 471 having an output terminal. The two input terminals of the input wiring 470 and the output terminal of the output wiring 471 each have a ring-shaped portion.

Although not shown in FIG. 11, as shown in FIG. 12, a first through hole 411h is provided at the other end in the longitudinal direction of the first busbar portion 411, a second through hole 412h is provided at the other end in the longitudinal direction of the second busbar portion 412, and a third through hole 413h is provided at the other end in the longitudinal direction of the third busbar portion 413. Only the portions of the first through hole 411h, the second through hole 412h, and the third through hole 413h are exposed from the hold portion.

The first busbar portion 411 is connected to the input wiring 470 by inserting a bolt 490 into one ring-shaped portion of the two input terminals of the input wiring 470 and the first through hole 411h and fastening the bolt 490 with a nut 480.

The second busbar portion 412 is connected to the input wiring 470 by inserting a bolt 490 into the other ring-shaped portion of the two input terminals of the input wiring 470 and the second through hole 412h and fastening the bolt 490 with a nut 480.

The third busbar portion 413 is connected to the output wiring 471 by inserting a bolt 490 into the ring-shaped portion of the output terminal of the output wiring 471 and the third through hole 413h and fastening the bolt 490 with a nut 480.

By the connection as described above, the current input to the first busbar portion 411 is output from the third busbar portion 413 through the first coupling portion 414. Also, the current input to the second busbar portion 412 is output from the third busbar portion 413 through the first coupling portion 414.

That is, in the first coupling portion 414, a direction 44 in which the current flows through a portion located at the first busbar portion 411 side with respect to the third busbar portion 413 is opposite to a direction 45 in which the current flows through a portion located at the second busbar portion 412 side with respect to the third busbar portion 413.

The method for connecting the busbar 410 and the external wiring is not limited to the above-described method, and may be other method as long as the direction in which the current flows through the first busbar portion 411 and the direction in which the current flows through the second busbar portion 412 are opposite to the direction in which the current flows through the third busbar portion 413.

Hence, the first busbar portion 411 and the second busbar portion 412 may be connected to the output wiring, and the third busbar portion 413 may be connected to the input wiring.

As shown in FIG. 11, the first magnetic sensor 420 is located between the first busbar portion 411 and the third busbar portion 413. The second magnetic sensor 421 is located between the second busbar portion 412 and the third busbar portion 413.

The first magnetic sensor 420 has a detection axis in a direction indicated by an arrow 420a in FIG. 11, that is, a direction being orthogonal to the arrangement direction of the first busbar portion 411, the second busbar portion 412, and the third busbar portion 413, and a direction being orthogonal to the extending direction of the third busbar portion 413.

The second magnetic sensor 421 has a detection axis in a direction indicated by an arrow 421a in FIG. 11, that is, a direction being orthogonal to the arrangement direction of the first busbar portion 411, the second busbar portion 412, and the third busbar portion 413, and a direction being orthogonal to the extending direction of the third busbar portion 413.

The first magnetic sensor 420 and the second magnetic sensor 421 each have odd function input/output characteristics that output a magnetic field as a positive value in case of detecting the magnetic field oriented in one direction of the detection axis, and output a magnetic field as a negative value in case of detecting the magnetic field oriented in a direction opposite to the one direction of the detection axis. That is, regarding the intensity of the magnetic field generated by the current of the measurement subject flowing through the busbar 410, the phase of the detection value of the first magnetic sensor 420 is opposite to the phase of the detection value of the second magnetic sensor 421.

As the first magnetic sensor 420 and the second magnetic sensor 421, a magnetic sensor having a magnetic resistance element, such as AMR (Anisotropic Magento Resistance), GMR (Giant Magneto Resistance), TMR (Tunnel Magneto Resistance), BMR (Balistic Magneto Resistance), or CMR (Colossal Magneto Resistance) can be used. In particular, a magnetic sensor that uses an AMR element with a barber-pole structure having odd function input/output characteristics and forms a Wheatstone-bridge-type bridge circuit or a half bridge circuit with a circuit configuration being a half of the bridge circuit can be used.

Alternatively, as the first magnetic sensor 420 and the second magnetic sensor 421, a magnetic sensor having a Hall element, a magnetic sensor having a MI (Magneto Impedance) element using a magnetic impedance effect, a flux-gate-type magnetic sensor, etc., may be used.

If a bias is applied to the first magnetic sensor 420 and the second magnetic sensor 421, without limiting to the method using the barber-pole structure, a bias may be applied by using an induction field generated around a coil, a magnetic field of a permanent magnet, or a magnetic field of the combination of these. Still alternatively, a bias may be applied by providing a film-shaped magnetic body layer on the same substrate as the substrate with a film-shaped element forming a magnetic sensor arranged thereon.

The first magnetic sensor 420 is electrically connected to the subtracter 430 by first connection wiring 441. The second magnetic sensor 421 is electrically connected to the subtracter 430 by second connection wiring 442. These connection portions form a single magnetic sensor module. That is, in this embodiment, a single magnetic sensor module includes two magnetic sensors.

The subtracter 430 calculates the value of the current of the measurement subject flowing through the busbar 410 by subtracting the detection value of the second magnetic sensor 421 from the detection value of the first magnetic sensor 420. In this embodiment, the subtracter 430 is used as calculating means; however, the calculating means is not limited thereto, and may use a differential amplifier.

An operation of the current sensor 400 is described below.

Figure 13:
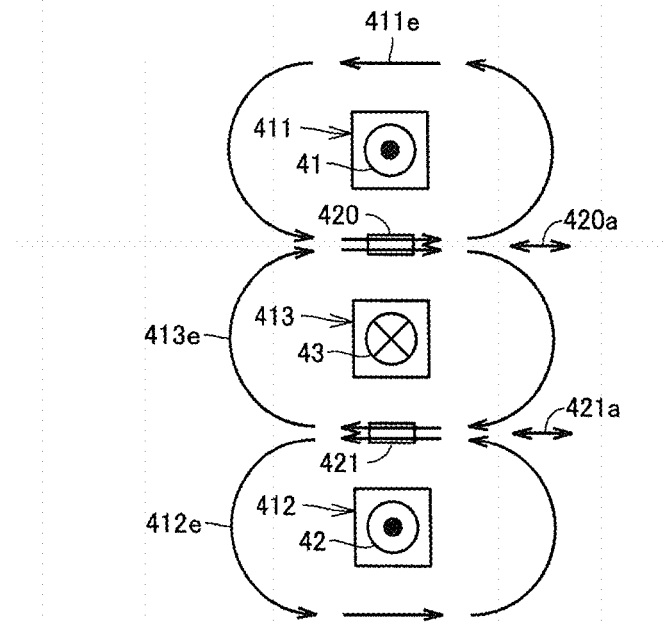
FIG. 13 is an illustration schematically showing a magnetic field generated in a cross-sectional view when the current sensor according to the second embodiment of the invention is viewed in a direction indicated by arrow XIII-XIII in FIG. 11.

FIG. 13 is an illustration schematically showing a magnetic field generated in a cross-sectional view when the current sensor 400 according to this embodiment is viewed in a direction indicated by arrow XIII-XIII in FIG. 11.

As shown in FIG. 13, when the current flows through the first busbar portion 411, a magnetic field 411*e* circulating counterclockwise in the drawing is generated according to so-called right-handed screw rule. Similarly, when the current flows through the second busbar portion 412, a magnetic field 412*e* circulating counterclockwise in the drawing is generated. When the current flows through the third busbar portion 413, a magnetic field 413*e* circulating clockwise in the drawing is generated.

Consequently, a magnetic field in the right direction in the drawing is applied to the first magnetic sensor 420 in the direction of the detection axis indicated by the arrow 420*a*. In contrast, a magnetic field in the left direction in the drawing is applied to the second magnetic sensor 421 in the direction of the detection axis indicated by the arrow 421*a*.

Hence, if the detection value indicative of the intensity of the magnetic field detected by the first magnetic sensor 420 is a positive value, the detection value indicative of the intensity of the magnetic field detected by the second magnetic sensor 421 is a negative value. The detection value of the first magnetic sensor 420 and the detection value of the second magnetic sensor 421 are transmitted to the subtracter 430.

The subtracter 430 subtracts the detection value of the second magnetic sensor 421 from the detection value of the first magnetic sensor 420. Consequently, the absolute value of the detection value of the first magnetic sensor 420 and the absolute value of the detection value of the second magnetic sensor 421 are added. With this addition result, the value of the current of the measurement subject flowing through the busbar 410 is calculated.

In the current sensor 400 according to this embodiment, since the third busbar portion 413 is located between the first magnetic sensor 420 and the second magnetic sensor 421, an external magnetic field source cannot be physically located between the first magnetic sensor 420 and the second magnetic sensor 421.

Hence, the orientation of a magnetic field component in the direction of the detection axis indicated by the arrow 420*a* among the magnetic field applied to the first magnetic sensor 420 from the external magnetic field source is the same orientation as the orientation of a magnetic field component in the direction of the detection axis indicated by the arrow 421*a* among the magnetic field applied to the second magnetic sensor 421 from the external magnetic field source. Hence, if the detection value indicative of the intensity of the external magnetic field detected by the first magnetic sensor 420 is a positive value, the detection value indicative of the intensity of the external magnetic field detected by the second magnetic sensor 421 is also a positive value.

Consequently, the subtracter 430 subtracts the detection value of the second magnetic sensor 421 from the detection value of the first magnetic sensor 420, and hence subtraction is executed on the absolute value of the detection value of the first magnetic sensor 420 and the absolute value of the detection value of the second magnetic sensor 421. Accordingly, the magnetic field from the external magnetic field source is hardly detected. That is, the influence of the external magnetic field is decreased.

Alternatively, in the first magnetic sensor 420 and the second magnetic sensor 421, the directions of the detection axes providing positive detection values may be arranged in mutually opposite directions (opposite by 180°). In this case, if the detection value indicative of the intensity of the external magnetic field detected by the first magnetic sensor 420 is a positive value, the detection value indicative of the intensity of the external magnetic field detected by the second magnetic sensor 421 is a negative value.

In contrast, regarding the intensity of the magnetic field generated by the current of the measurement subject flowing through the busbar 410, the phase of the detection value of the first magnetic sensor 420 is the same as the phase of the detection value of the second magnetic sensor 421.

With this configuration, an adder is used instead of the subtracter 430 as the calculating means. Regarding the external magnetic field, the adder adds the detection value of the first magnetic sensor 420 and the detection value of the second magnetic sensor 421, and hence subtraction is executed on the absolute value of the detection value of the first magnetic sensor 420 and the absolute value of the detection value of the second magnetic sensor 421. Accordingly, the magnetic field from the external magnetic field source is hardly detected. That is, the influence of the external magnetic field is decreased.

Also, regarding the magnetic field generated by the current of the measurement subject flowing through the busbar 410, the adder adds the detection value of the first magnetic sensor 420 and the detection value of the second magnetic sensor 421, and hence the absolute value of the detection value of the first magnetic sensor 420 and the absolute value of the detection value of the second magnetic sensor 421 are added. With this addition result, the value of the current of the measurement subject flowing through the busbar 410 is calculated.

As described above, the adder may be used as the calculating means instead of the subtracter 430 while the input/output characteristics of the first magnetic sensor 420 and the second magnetic sensor 421 may have mutually opposite polarities.

In the current sensor 400 according to this embodiment, the first busbar portion 411 and the second busbar portion 412 are point-symmetrically arranged to each other in a cross section about the center point of the third busbar portion 413. Also, the first busbar portion 411 and the second busbar portion 412 are line-symmetrically arranged to each other in a cross section about the center line of the third busbar portion 413 in the direction of the detection axes of the first magnetic sensor 420 and the second magnetic sensor 421.

Also, the first magnetic sensor 420 and the second magnetic sensor 421 are point-symmetrically arranged to each other in a cross section about the center point of the third busbar portion 413. Also, the first magnetic sensor 420 and the second magnetic sensor 421 are line-symmetrically arranged to each other in a cross section about the center line of the third busbar portion 413 in the direction of the detection axes of the first magnetic sensor 420 and the second magnetic sensor 421.

Effects to be obtained by the above-described arrangement are described now.

Figure 14:
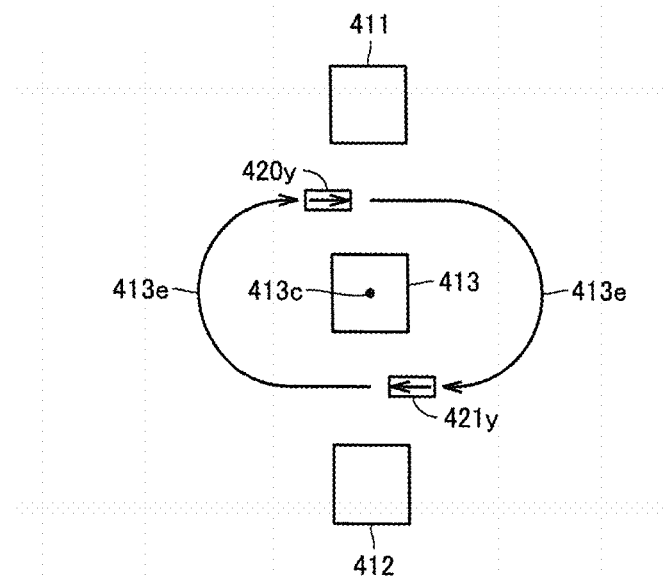
FIG. 14 is a cross-sectional view showing a state in which the first busbar portion and the second busbar portion are point-symmetrically arranged to each other and a first magnetic sensor and a second magnetic sensor are point-symmetrically arranged to each other.

FIG. 14 is a cross-sectional view showing a state in which the first busbar portion and the second busbar portion are point-symmetrically arranged to each other and a first magnetic sensor and a second magnetic sensor are point-symmetrically arranged to each other. FIG. 14 is the same cross section as FIG. 13.

As shown in FIG. 14, the first busbar portion 411 and the second busbar portion 412 are point-symmetrically arranged to each other in a cross section about a center point 413$c$ of the third busbar portion 413. Also, a first magnetic sensor 420$y$ and a second magnetic sensor 421$y$ are point-symmetrically arranged to each other in a cross section about the center point 413$c$ of the third busbar portion 413.

In case of this arrangement, the magnetic field 413$e$ generated by the current of the measurement subject flowing through the busbar 410 and circulating around the third busbar portion 413 is applied to the first magnetic sensor 420$y$ and the second magnetic sensor 421$y$ equivalently in the opposite directions. Consequently, when the subtracter 430 subtracts the detection value of the second magnetic sensor 421$y$ from the detection value of the first magnetic sensor 420$y$, the detection value of the magnetic field 413$e$ is doubled.

In contrast, if the external magnetic field source is located at a position sufficiently far from the first magnetic sensor 420$y$ and the second magnetic sensor 421$y$, the external magnetic field is applied to the first magnetic sensor 420$y$ and the second magnetic sensor 421$y$ equivalently in the same direction. Consequently, when the subtracter 430 subtracts the detection value of the second magnetic sensor 421$y$ from the detection value of the first magnetic sensor 420$y$, the detection value of the external magnetic field becomes 0.

The first magnetic sensor 420$y$ and the second magnetic sensor 421$y$ point-symmetrically arranged as described above provide the detection values equally reflecting the magnetic field generated by the current of the measurement subject flowing through the busbar 410. Hence, the linearity of the intensity of the magnetic field generated by the current of the measurement subject flowing through the busbar 410 and the value of the current of the measurement subject flowing through the busbar 410 calculated from the intensity can be increased.

Figure 15:
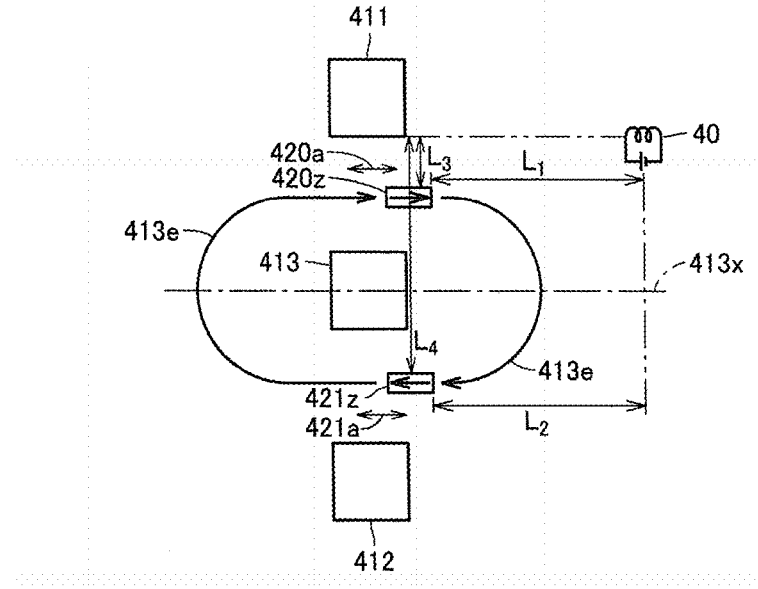
FIG. 15 is a cross-sectional view showing a state in which the first busbar portion and the second busbar portion are line-symmetrically arranged to each other and a first magnetic sensor and a second magnetic sensor are line-symmetrically arranged to each other.

FIG. 15 is a cross-sectional view showing a state in which the first busbar portion and the second busbar portion are line-symmetrically arranged to each other and a first magnetic sensor and a second magnetic sensor are line-symmetrically arranged to each other. FIG. 15 shows the same cross section as FIG. 13.

As shown in FIG. 15, the first busbar portion 411 and the second busbar portion 412 are line-symmetrically arranged to each other in a cross section about a center line 413$x$ of the third busbar portion 413 in the direction of the detection axes of the first magnetic sensor 420$z$ and the second magnetic sensor 421$z$.

Also, a first magnetic sensor 420$z$ and a second magnetic sensor 421$z$ are line-symmetrically arranged to each other in a cross section about the center line 413$x$ f the third busbar portion 413 in the direction of the detection axes of the first magnetic sensor 420$z$ and the second magnetic sensor 421$z$.

That is, the first recess portion that houses the first magnetic sensor 420 and the second recess portion that houses the second magnetic sensor 421 are line-symmetrically arranged to each other in a cross section about the center line 413$x$ of the third busbar portion 413 in the direction of the detection axes.

In case of this arrangement, the magnetic field 413$e$ generated by the current of the measurement subject flowing through the busbar 410 and circulating around the third busbar portion 413 is applied to the first magnetic sensor 420$z$ and the second magnetic sensor 421$z$ equivalently in the opposite directions. Consequently, when the subtracter 430 subtracts the detection value of the second magnetic sensor 421$z$ from the detection value of the first magnetic sensor 420$z$, the detection value of the magnetic field 413$e$ is doubled.

In contrast, if an external magnetic field source is located at a position sufficiently far from the first magnetic sensor 420$z$ and the second magnetic sensor 421$z$, the external magnetic field is applied to the first magnetic sensor 420$z$ and the second magnetic sensor 421$z$ equivalently in the same direction. Consequently, when the subtracter 430 subtracts the detection value of the second magnetic sensor 421$z$ from the detection value of the first magnetic sensor 420$z$, the detection value of the external magnetic field becomes 0.

Further, if an external magnetic field source 40 is located near the first magnetic sensor 420$z$ and the second magnetic sensor 421$z$, a distance $L_1$ from the external magnetic field source 40 to the first magnetic sensor 420$z$ in the direction of the detection axis of the first magnetic sensor 420$z$ indicated by the arrow 420$a$ becomes equal to a distance $L_2$ from the external magnetic field source 40 to the second magnetic sensor 421$z$ in the direction of the detection axis of the second magnetic sensor 421$z$ indicated by the arrow 421$a$.

Accordingly, even if the external magnetic field source 40 is closely located, the external magnetic field is applied to the first magnetic sensor 420$z$ and the second magnetic sensor 421$z$ equivalently in the same direction. Consequently, when the subtracter 430 subtracts the detection value of the second magnetic sensor 421z from the detection value of the first magnetic sensor 420z, the detection value of the external magnetic field becomes 0.

It is to be noted that a distance $L_3$ from the external magnetic field source 40 to the first magnetic sensor 420z in a direction orthogonal to the direction of the detection axis of the first magnetic sensor 420z indicated by the arrow 420a differs from a distance $L_4$ from the external magnetic field source 40 to the second magnetic sensor 421z in a direction orthogonal to the direction of the detection axis of the second magnetic sensor 421z indicated by the arrow 421a. However, a magnetic field component in this direction is not detected by the first magnetic sensor 420z or the second magnetic sensor 421z.

The first magnetic sensor 420z and the second magnetic sensor 421z line-symmetrically arranged as described above provide the detection values equally reflecting the magnetic field generated by the current of the measurement subject flowing through the busbar 410. Hence, the linearity of the intensity of the magnetic field generated by the current of the measurement subject flowing through the busbar 410 and the value of the current of the measurement subject flowing through the busbar 410 calculated from the intensity can be increased. Further, even if the external magnetic field source 40 is located near the first magnetic sensor 420z and the second magnetic sensor 421z, the influence of the external magnetic field can be decreased.

Since the current sensor 400 according to this embodiment satisfies both the above-described point-symmetric arrangement and line-symmetric arrangement, regardless of the position of the external magnetic field source 40, the influence of the external magnetic field can be decreased while the linearity of the intensity of the magnetic field generated by the current of the measurement subject flowing through the busbar 410 and the value of the current of the measurement subject flowing through the busbar 410 calculated from the intensity can be increased.

Also, in the current sensor 400, regarding the magnetic field generated between the first busbar portion 411 and the third busbar portion 413, the change in magnetic field depending on the distance from each busbar portion is relatively small. Hence, high accuracy is not required for the arrangement of the first magnetic sensor 420.

Similarly, regarding the magnetic field generated between the second busbar portion 412 and the third busbar portion 413, the change in magnetic field depending on the distance from each busbar portion is relatively small. Hence, high accuracy is not required for the arrangement of the second magnetic sensor 421. Accordingly, the current sensor 400 can be easily manufactured.

That is, the recess portion that houses the magnetic sensor module can be easily formed at a position at which the first magnetic sensor 420 and the second magnetic sensor 421 should be arranged.

A current sensor according to a modification of this embodiment is described below. The current sensor according to this modification differs from the current sensor 400 according to the second embodiment only in the structure of a busbar. Therefore, the description of the other configuration will not be repeated.

Figure 16:
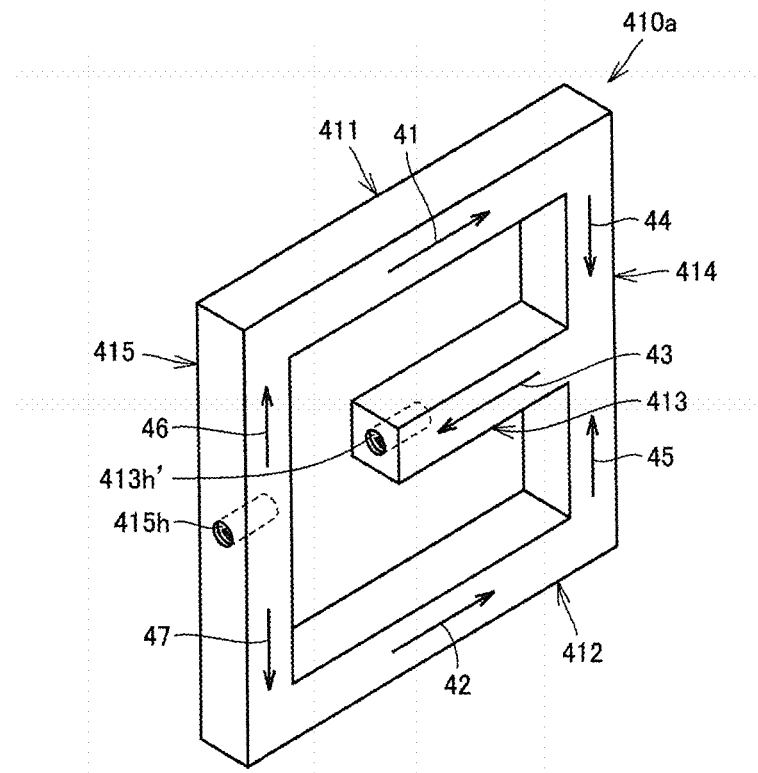
FIG. 16 is a perspective view showing a structure of a busbar of a current sensor according to a modification of the second embodiment of the invention.

FIG. 16 is a perspective view showing a structure of a busbar of a current sensor according to the modification of this embodiment. As shown in FIG. 16, a busbar 410a of the current sensor according to the modification has a ring-like shape in plan view because both ends of the first busbar portion 411 and both ends of the second busbar portion 412 are connected to each other.

To be specific, the other end in the longitudinal direction of the first busbar portion 411 and the other end in the longitudinal direction of the second busbar portion 412 are coupled to each other by a second coupling portion 415. The second coupling portion 415 extends in a direction in which the first busbar portion 411, the second busbar portion 412, and the third busbar portion 413 are arranged. That is, the second coupling portion 415 is orthogonal to each of the first busbar portion 411 and the second busbar portion 412.

The second coupling portion 415 has a rectangular-parallelepiped-like shape. However, the shape of the second coupling portion 415 is not limited to the rectangular-parallelepiped-like shape, and may be, for example, a columnar shape.

The busbar 410a of the current sensor according to the modification has a first internal thread 415h at a center portion in the extending direction of the second coupling portion 415, and a second internal thread 413h' at the other end in the longitudinal direction of the third busbar portion 413. Only the first internal thread 415h and the second internal thread 413h' are exposed from the hold portion.

Although not shown, the second coupling portion 415 is connected to the input wiring by inserting a bolt into the input terminal of the input wiring and fastening the bolt with the first internal thread 415h. The third busbar portion 413 is connected to the output wiring by inserting a bolt into the output terminal of the output wiring and fastening the bolt with the second internal thread 413h'.

By the connection as described above, the current input to the second coupling portion 415 is output from the third busbar portion 413 through the first busbar portion 411, the second busbar portion 412, and the first coupling portion 414.

That is, in the second coupling portion 415, a direction 46 in which the current flows through a portion located at the first busbar portion 411 side with respect to the third busbar portion 413 is opposite to a direction 47 in which the current flows through a portion located at the second busbar portion 412 side with respect to the third busbar portion 413.

The method for connecting the busbar 410a and the external wiring is not limited to the above-described method, and may be other method as long as the direction in which the current flows through the first busbar portion 411 and the direction in which the current flows through the second busbar portion 412 are opposite to the direction in which the current flows through the third busbar portion 413.

Hence, the second coupling portion 415 may be connected to the output wiring and the third busbar portion 413 may be connected to the input wiring.

With the current sensor according to the modification, the mechanical intensity of the busbar 410a can become higher as compared with the mechanical intensity of the busbar 410 according to the second embodiment. Also, since the number of the connection portions with respect to the external wiring is decreased and a nut is not required, the connection to the external wiring can be easily executed as compared with the busbar 410 according to the second embodiment.

In the current sensor according to any of this embodiment and the modification, since the busbar module and the magnetic sensor module are the separate configurations, the user of the current sensor can customize the current sensor by selecting a combination of a structure of busbar and a type of magnetic sensor.

A current sensor according to a third embodiment of the invention is described below with reference to the drawings. A current sensor 500 according to this embodiment differs from the current sensor 400 according to the second embodiment only in that the width of a busbar is increased. Therefore, the description of the other configuration will not be repeated.

Third Embodiment

Figure 17:
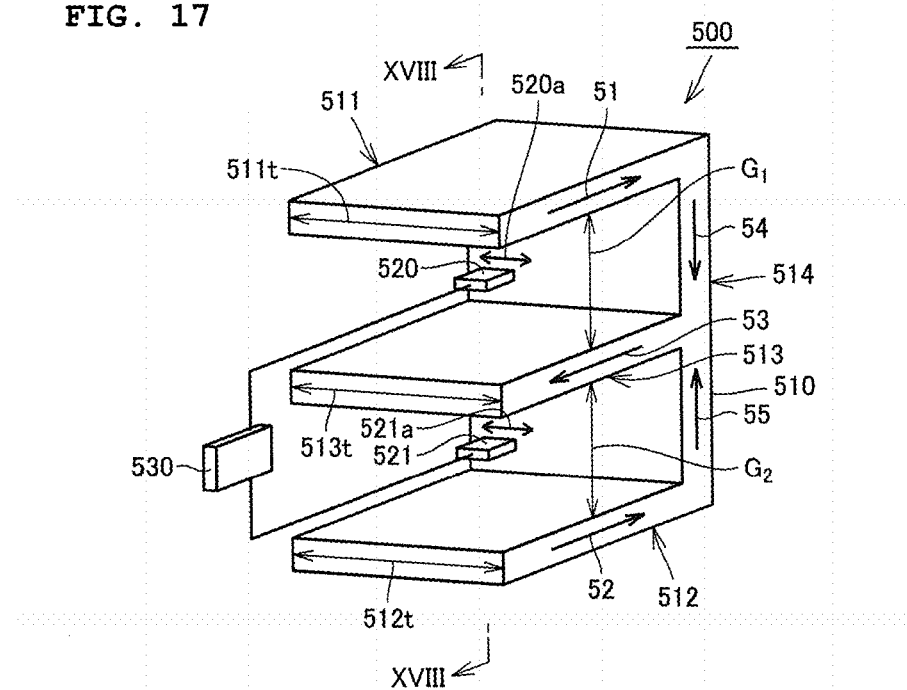
FIG. 17 is a perspective view showing a portion of a configuration of a current sensor according to a third embodiment of the invention.

FIG. 17 is a perspective view showing a portion of a configuration of the current sensor according to the third embodiment of the invention. FIG. 17 does not illustrate a hold portion.

As shown in FIG. 17, the current sensor 500 according to the third embodiment of the invention includes a busbar 510 through which current of a measurement subject flows. Also, the current sensor 500 includes a first magnetic sensor 520 and a second magnetic sensor 521 that each have odd function input/output characteristics and detect the intensity of a magnetic field generated by the current of the measurement subject flowing through the busbar 510.

Further, the current sensor 500 includes a subtracter 530 serving as calculating means for calculating a value of the current by executing subtraction on the respective detection values of the first magnetic sensor 520 and the second magnetic sensor 521.

The busbar 510 includes a first busbar portion 511 and a second busbar portion 512 connected in electrically parallel to each other and located in parallel to each other with a gap interposed therebetween. The busbar 510 further includes a third busbar portion 513 arranged at an intermediate position between the first busbar portion 511 and the second busbar portion 512 and extending in parallel to each of the first busbar portion 511 and the second busbar portion 512 with gaps interposed therebetween. In this case, a gap $G_1$ between the first busbar portion 511 and the third busbar portion 513 is equal to a gap $G_2$ between the second busbar portion 512 and the third busbar portion 513.

In this embodiment, the first busbar portion 511, the second busbar portion 512, and the third busbar portion 513 have rectangular-parallelepiped-like shapes and are arranged at regular intervals. One end in the longitudinal direction of the first busbar portion 511, one end in the longitudinal direction of the second busbar portion 512, and one end in the longitudinal direction of the third busbar portion 513 are connected to each other by a first coupling portion 514.

The first coupling portion 514 has a rectangular-parallelepiped-like shape and extends in a direction in which the first busbar portion 511, the second busbar portion 512, and the third busbar portion 513 are arranged. That is, the first coupling portion 514 is orthogonal to each of the first busbar portion 511, the second busbar portion 512, and the third busbar portion 513. As described above, the busbar 510 has an E-like shape in plan view.

As shown in FIG. 17, the first magnetic sensor 520 is located between the first busbar portion 511 and the third busbar portion 513. Both principal surfaces of the first magnetic sensor 520 respectively face the first busbar portion 511 and the third busbar portion 513. The second magnetic sensor 521 is located between the second busbar portion 512 and the third busbar portion 513. Both principal surfaces of the second magnetic sensor 521 respectively face the second busbar portion 512 and the third busbar portion 513.

The first magnetic sensor 520 has a detection axis in a direction indicated by an arrow 520a in FIG. 17, that is, a direction being orthogonal to the arrangement direction of the first busbar portion 511, the second busbar portion 512, and the third busbar portion 513, and a direction being orthogonal to the extending direction of the third busbar portion 513.

The second magnetic sensor 521 has a detection axis in a direction indicated by an arrow 521a in FIG. 17, that is, a direction being orthogonal to the arrangement direction of the first busbar portion 511, the second busbar portion 512, and the third busbar portion 513, and a direction being orthogonal to the extending direction of the third busbar portion 513.

The first magnetic sensor 520 and the second magnetic sensor 521 each have odd function input/output characteristics that output a magnetic field as a positive value in case of detecting the magnetic field oriented in one direction of the detection axis, and output a magnetic field as a negative value in case of detecting the magnetic field oriented in a direction opposite to the one direction of the detection axis.

The first magnetic sensor 520 is electrically connected to the subtracter 530 by connection wiring. The second magnetic sensor 521 is electrically connected to the subtracter 530 by connection wiring. These connection portions form a single magnetic sensor module. That is, in this embodiment, a single magnetic sensor module includes two magnetic sensors.

The subtracter 530 calculates the value of the current of the measurement subject flowing through the busbar 510 by subtracting the detection value of the second magnetic sensor 521 from the detection value of the first magnetic sensor 520.

In the directions of the detection axes of the first and second magnetic sensors 520 and 521 indicated by the arrows 520a and 521a in FIG. 17, a dimension 511t of the width of the first busbar portion 511, a dimension 512t of the width of the second busbar portion 512, and a dimension 513t of the width of the third busbar portion 513 each are 1.5 times of each of the dimensions $G_1$ and $G_2$ of the gaps between the mutually neighboring busbar portions.

Hence, the dimension 511t of the width of the first busbar portion 511, the dimension 512t of the width of the second busbar portion 512, and the dimension 513t of the width of the third busbar portion 513 are each 1.5 $G_1$. As described later, the dimension 511t of the width of the first busbar portion 511, the dimension 512t of the width of the second busbar portion 512, and the dimension 513t of the width of the third busbar portion 513 are each preferably 1.5 $G_1$ or larger, and more preferably 2.0 $G_1$ or larger.

A direction 51 in which current flows through the first busbar portion 511 is the same as a direction 52 in which current flows through the second busbar portion 512. The direction 51 in which current flows through the first busbar portion 511 and the direction 52 in which current flows through the second busbar portion 512 are opposite to a direction 53 in which current flows through the third busbar portion 513.

In this embodiment, similarly to the current sensor 400 according to the second embodiment shown in FIG. 12, the busbar 510 is connected to external wiring including input wiring and output wiring. Hence, the current input to the first busbar portion 511 is output from the third busbar portion 513 through the first coupling portion 514. Also, the current input to the second busbar portion 512 is output from the third busbar portion 513 through the first coupling portion 514.

That is, in the first coupling portion 514, a direction 54 in which the current flows through a portion located at the first busbar portion 511 side with respect to the third busbar portion 513 is opposite to a direction 55 in which the current flows through a portion located at the second busbar portion 512 side with respect to the third busbar portion 513.

Figure 18:
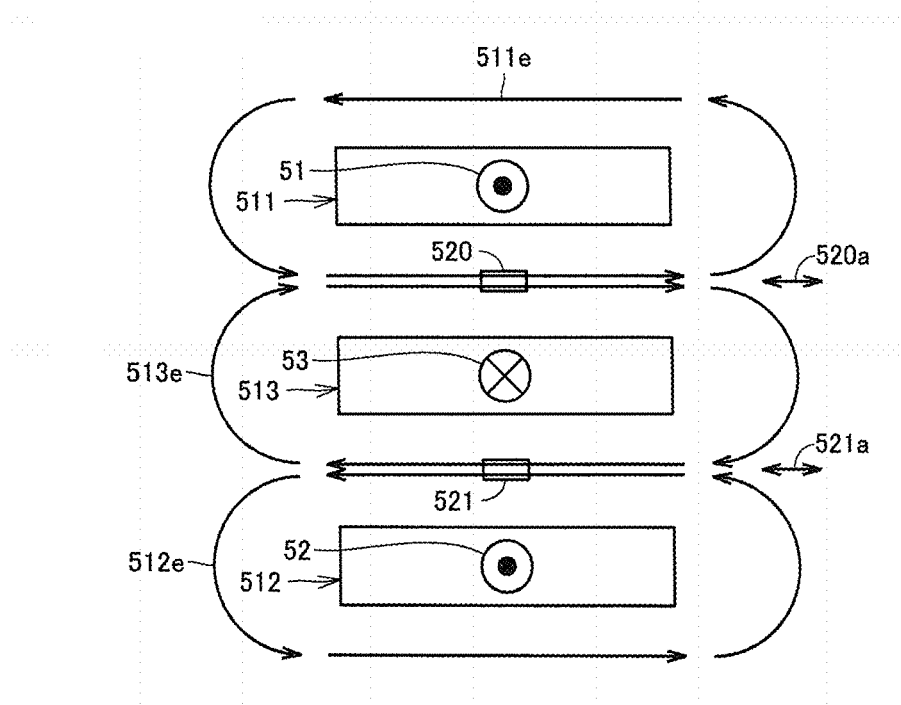
FIG. 18 is an illustration schematically showing a magnetic field generated in a cross-sectional view when the current sensor according to the third embodiment of the invention is viewed in a direction indicated by arrow XVIII-XVIII in FIG. 17.

FIG. 18 is an illustration schematically showing a magnetic field generated in a cross-sectional view when the current sensor 500 according to this embodiment is viewed in a direction indicated by arrow XVIII-XVIII in FIG. 17.

As shown in FIG. 18, when the current flows through the first busbar portion 511, a magnetic field 511e circulating counterclockwise in the drawing is generated. Similarly, when the current flows through the second busbar portion 512, a magnetic field 512e circulating counterclockwise in the drawing is generated. When the current flows through the third busbar portion 513, a magnetic field 513e circulating clockwise in the drawing is generated.

Consequently, a magnetic field in the right direction (clockwise) in the drawing is applied to the first magnetic sensor 520 in the direction of the detection axis indicated by the arrow 520a. In contrast, a magnetic field in the left direction (counterclockwise) in the drawing is applied to the second magnetic sensor 521 in the direction of the detection axis indicated by the arrow 521a.

Hence, if the detection value indicative of the intensity of the magnetic field detected by the first magnetic sensor 520 is a positive value, the detection value indicative of the intensity of the magnetic field detected by the second magnetic sensor 521 is a negative value. The detection value of the first magnetic sensor 520 and the detection value of the second magnetic sensor 521 are transmitted to the subtracter 530.

The subtracter 530 subtracts the detection value of the second magnetic sensor 521 from the detection value of the first magnetic sensor 520. Consequently, the absolute value of the detection value of the first magnetic sensor 520 and the absolute value of the detection value of the second magnetic sensor 521 are added. With this addition result, the value of the current of the measurement subject flowing through the busbar 510 is calculated.

Figure 19:
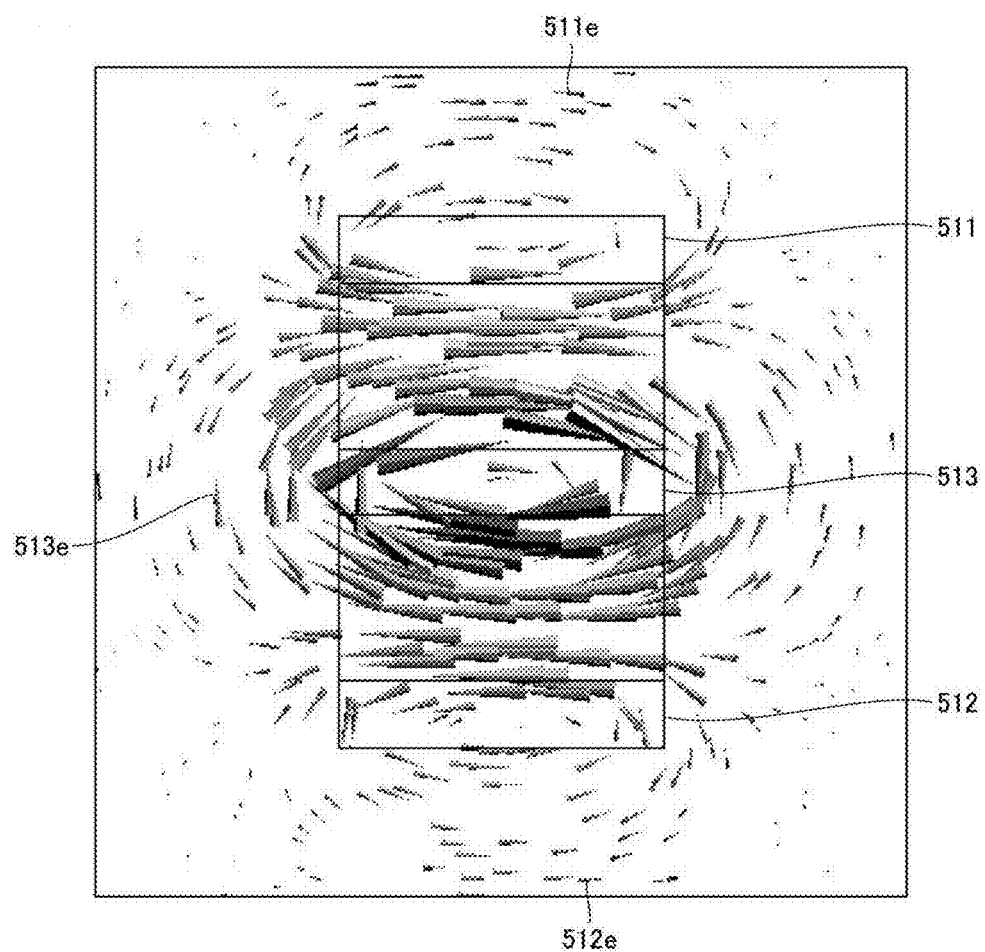
FIG. 19 is a magnetic flux diagram showing a simulation result of the magnetic flux density of a magnetic field generated by current of a measurement subject flowing through a busbar, in the periphery of the busbar of the current sensor according to the third embodiment of the invention.
Figure 20:
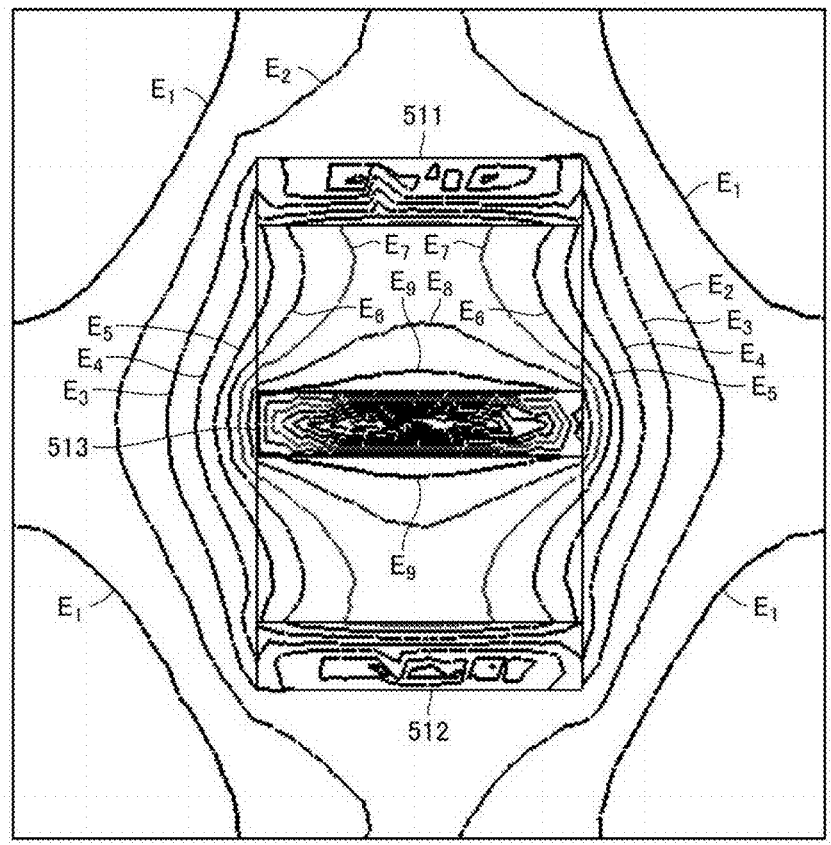
FIG. 20 is a contour diagram showing a simulation result of the magnetic flux density of the magnetic field generated by the current of the measurement subject flowing through the busbar, in the periphery of the busbar of the current sensor according to the third embodiment of the invention.

FIG. 19 is a magnetic flux diagram showing a simulation result of the magnetic flux density of a magnetic field generated by the current of the measurement subject flowing through the busbar 510, in the periphery of the busbar 510 of the current sensor 500 according to this embodiment. FIG. 20 is a contour diagram showing a simulation result of the magnetic flux density of the magnetic field generated by the current of the measurement subject flowing through the busbar 510, in the periphery of the busbar 510 of the current sensor 500 according to this embodiment. FIGS. 19 and 20 show the same cross section as FIG. 18.

Figure 21:
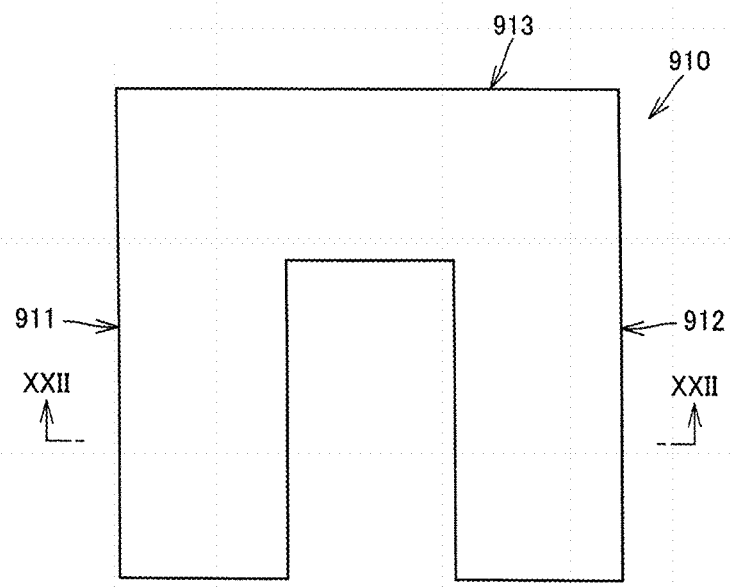
FIG. 21 is a plan view showing a shape of a busbar included in a current sensor according to a comparative example.
Figure 22:
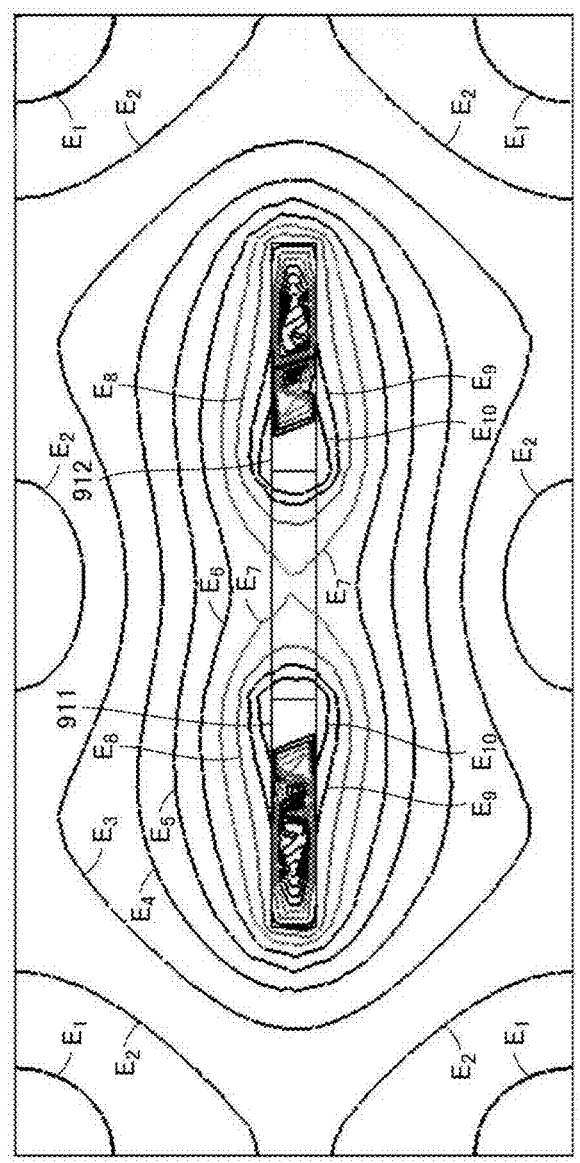
FIG. 22 is a contour diagram showing a simulation result of the magnetic flux density of a magnetic field generated by current of a measurement subject flowing through the busbar, in the periphery of the busbar of the current sensor according to the comparative example, in a cross section viewed in a direction indicated by arrow XXII-XXII in FIG. 21.

In this case, a current sensor according to a comparative example is prepared. The current sensor according to the comparative example includes a busbar 910 through which current of a measurement subject flows. FIG. 21 is a plan view showing a shape of the busbar 910 included in the current sensor according to the comparative example. FIG. 22 is a contour diagram showing a simulation result of the magnetic flux density of a magnetic field generated by the current of the measurement subject flowing through the busbar 910, in the periphery of the busbar 910 of the current sensor according to the comparative example, in a cross section viewed in a direction indicated by arrow XXII-XXII in FIG. 21.

As shown in FIG. 21, the busbar 910 included in the current sensor according to the comparative example includes a first busbar portion 911 and a second busbar portion 912 located in parallel to each other with a gap interposed therebetween. In the busbar 910, one end of the first busbar portion 911 is connected to one end of the second busbar portion 912 by a coupling portion 913. As shown in FIG. 22, the busbar 910 is formed in a thin-plate-like shape. Current flows from the first busbar portion 911 to the second busbar portion 912 through the coupling portion 913.

Figure 23:
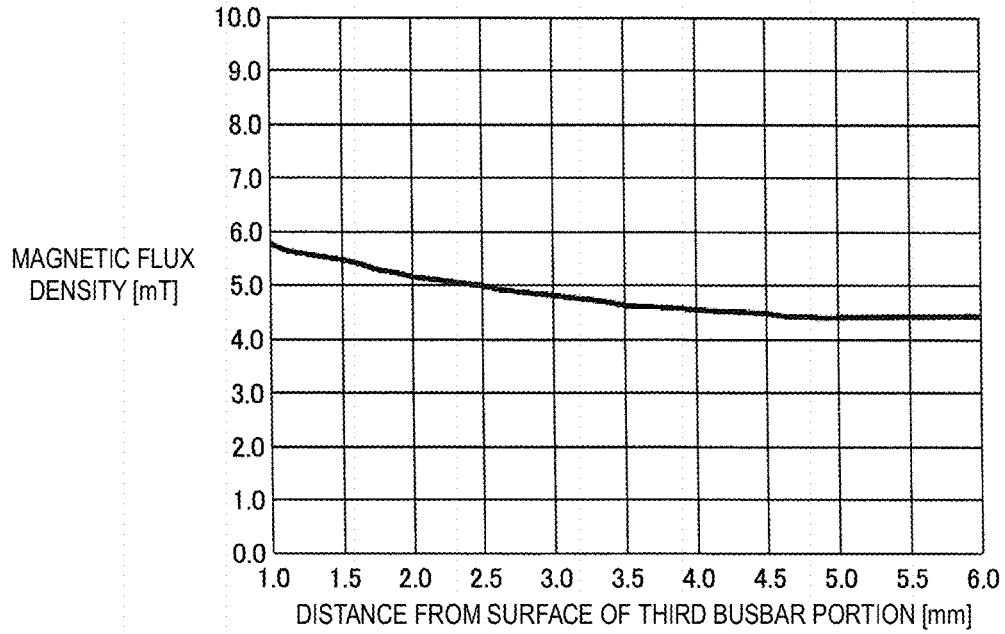
FIG. 23 is a graph showing the relationship between the distance separated in the up-down direction in FIG. 20 from a center portion of a third busbar portion in the left-right direction in FIG. 20 and the magnetic flux density, in the current sensor according to the third embodiment of the invention.

FIG. 23 is a graph showing the relationship between the distance separated in the up-down direction in FIG. 20 from a center portion of the third busbar portion 513 in the left-right direction in FIG. 20 and the magnetic flux density, in the current sensor 500 according to this embodiment. In FIG. 23, the vertical axis plots the magnetic flux density (mT) and the horizontal axis plots the distance (mm) from the surface of the third busbar portion 513.

Figure 24:
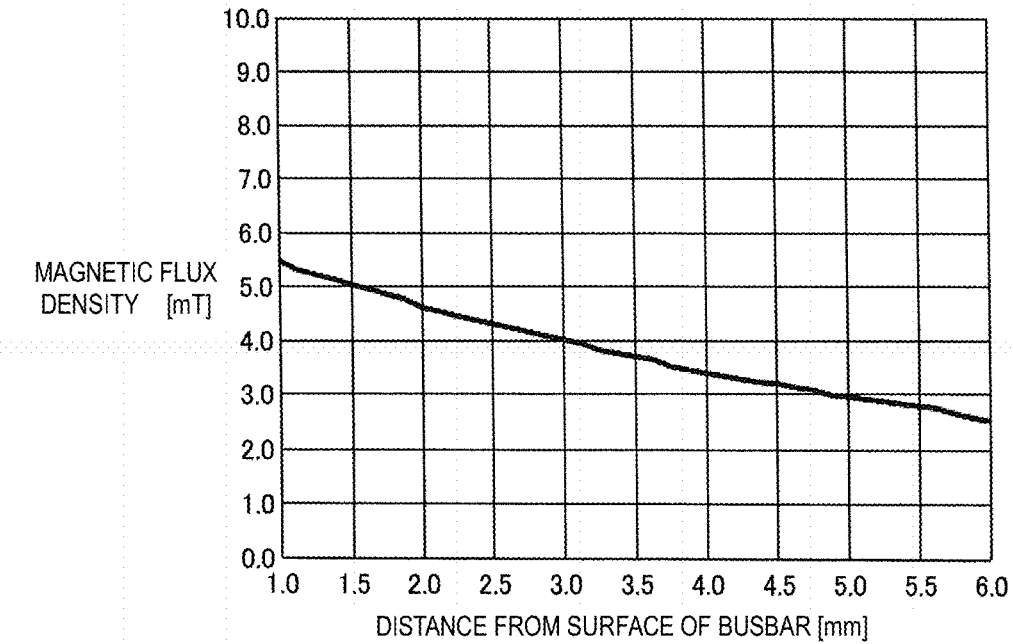
FIG. 24 is a graph showing the relationship between the distance separated in the up-down direction in FIG. 22 from a center portion of a first busbar portion or a center portion of a second busbar portion in the left-right direction in FIG. 22 and the magnetic flux density, in the current sensor according to the comparative example.

FIG. 24 is a graph showing the relationship between the distance separated in the up-down direction in FIG. 22 from a center portion of the first busbar portion 911 or a center portion of the second busbar portion 912 in the left-right direction in FIG. 22 and the magnetic flux density, in the current sensor according to the comparative example. In FIG. 24, the vertical axis plots the magnetic flux density (mT) and the horizontal axis plots the distance (mm) from the surface of the busbar 910.

In the simulation, it was assumed that the cross-sectional dimension of each busbar portion according to any of this embodiment and the comparative example is 2 mm×10 mm and the value of the current of the measurement subject flowing through each busbar is 100 A. In the busbar 510 according to this embodiment, the value of the current of the measurement subject flowing through the third busbar portion 513 is 100 A.

In FIGS. 20 and 22, $E_1$ represents a line with a magnetic flux density of 0.6 mT, $E_2$ represents a line with a magnetic flux density of 1.2 mT, $E_3$ represents a line with a magnetic flux density of 1.8 mT, $E_4$ represents a line with a magnetic flux density of 2.4 mT, $E_5$ represents a line with a magnetic flux density of 3.0 mT, $E_6$ represents a line with a magnetic flux density of 3.6 mT, $E_7$ represents a line with a magnetic flux density of 4.2 mT, $E_8$ represents a line with a magnetic flux density of 4.8 mT, $E_9$ represents a line with a magnetic flux density of 5.4 mT, and $E_{10}$ represents a line with a magnetic flux density of 6.0 mT.

As described above, in this embodiment, the dimension 511t of the width of the first busbar portion 511, the dimension 512t of the width of the second busbar portion 512, and the dimension 513t of the width of the third busbar portion 513 each are 1.5 times of each of the dimensions $G_1$ and $G_2$ of the gaps between the mutually neighboring busbar portions.

Accordingly, as shown in FIG. 19, the magnetic flux lines of the magnetic field generated between the first busbar portion 511 and the third busbar portion 513 and the magnetic flux lines of the magnetic field generated between the second busbar portion 512 and the third busbar portion 513 extend substantially linearly along the corresponding busbar portions in the left-right direction in the drawing. The left-right direction in the drawing corresponds to the directions of the detection axes of the first and second magnetic sensors 520 and 521.

As shown in FIGS. 20 and 23, in the busbar 510 according to this embodiment, a region where the magnetic flux density is higher than 4.8 mT is formed near the third busbar portion 513 in an area between the first busbar portion 511 and the third busbar portion 513.

Also, a region where the magnetic flux density is about 4.5 mT and is almost not changed is formed at a center portion in the left-right direction in the drawing at the first busbar portion 511 side in an area between the first busbar portion 511 and the third busbar portion 513.

Similarly, a region where the magnetic flux density is higher than 4.8 mT is formed near the third busbar portion 513 in an area between the second busbar portion 512 and the third busbar portion 513.

Also, a region where the magnetic flux density is about 4.5 mT and is almost not changed is formed at a center portion in the left-right direction in the drawing at the second busbar portion 512 side in an area between the second busbar portion 512 and the third busbar portion 513.

As shown in FIG. 22, in the busbar 910 according to the comparative example, the magnetic flux density is rapidly decreased as the distance is increased from a position near the first busbar portion 911 and a position near the second busbar portion 912 in an area between the first busbar portion 911 and the second busbar portion 912. There is not a region where the magnetic flux density is almost not changed.

Also, as shown in FIG. 24, in the busbar 910 according to the comparative example, the magnetic flux density is rapidly decreased as the distance is increased in the up-down direction in FIG. 22 from a center portion of the first busbar portion 911 or a center portion of the second busbar portion 912.

Hence, in the current sensor 500 according to this embodiment, by arranging the first magnetic sensor 520 at a position close to the third busbar portion 513 with respect to the first busbar portion 511 and arranging the second magnetic sensor 521 at a position close to the third busbar portion 513 with respect to the second busbar portion 512, the first magnetic sensor 520 and the second magnetic sensor 521 can be arranged in the regions with the high magnetic flux density. Accordingly, the SN ratio (signal-noise ratio) of the current sensor 500 can be increased. In this case, the sensitivity of the current sensor 500 can be increased.

Alternatively, in the current sensor 500 according to this embodiment, by arranging the first magnetic sensor 520 at a position close to the first busbar portion 511 with respect to the third busbar portion 513 and arranging the second magnetic sensor 521 at a position close to the second busbar portion 512 with respect to the third busbar portion 513, the first magnetic sensor 520 and the second magnetic sensor 521 can be arranged in the regions where the magnetic flux density is almost not changed. Accordingly, high accuracy is not required for the arrangement of the first magnetic sensor 520 or the second magnetic sensor 521. In this case, the current sensor 500 can be easily manufactured. This effect is stably obtained if the dimension 511$t$ of the width of the first busbar portion 511, the dimension 512$t$ of the width of the second busbar portion 512, and the dimension 513$t$ of the width of the third busbar portion 513 are each 1.5 $G_1$ or larger, and this effect is more apparent if the dimensions are each 2.0 $G_1$ or larger.

Even with the current sensor 500 according to this embodiment, the influence of the external magnetic field can be decreased. Also, since high accuracy is not required for the arrangement of the first magnetic sensor 520 or the second magnetic sensor 521, the current sensor 500 can be easily manufactured.

That is, the recess portion that houses the magnetic sensor module can be easily formed at a position at which the first magnetic sensor 520 and the second magnetic sensor 521 should be arranged.

Further, as shown in FIGS. 20 and 22, in the busbar 510 according to this embodiment, a region where the magnetic flux density is lower than 0.6 mT is formed near the busbar as compared with the busbar 910 according to the comparative example. That is, the leakage magnetic field of the busbar 510 according to this embodiment is smaller than the leakage magnetic field of the busbar 910 according to the comparative example.

Since the leakage magnetic field of the busbar is small, the influence given by the current sensor 500 to other current sensor or the like arranged near the current sensor 500 as an external magnetic field source can be decreased.

Hence, for example, when the output current of a three-phase alternating-current inverter is controlled, if a plurality of paths through which large current flows are arranged in a gathered manner, the value of the current flowing through each path can be further correctly detected by using the current sensor 500 according to this embodiment.

In the current sensor according to this embodiment, since the busbar module and the magnetic sensor module are the separate configurations, the user of the current sensor can customize the current sensor by selecting a combination of a structure of busbar and a type of magnetic sensor.

A current sensor according to a fourth embodiment of the invention is described below with reference to the drawings. A current sensor 600 according to this embodiment differs from the current sensor 500 according to the third embodiment only in that two busbar members form a busbar. Therefore, the description of the other configuration will not be repeated.

Fourth Embodiment

Figure 25:
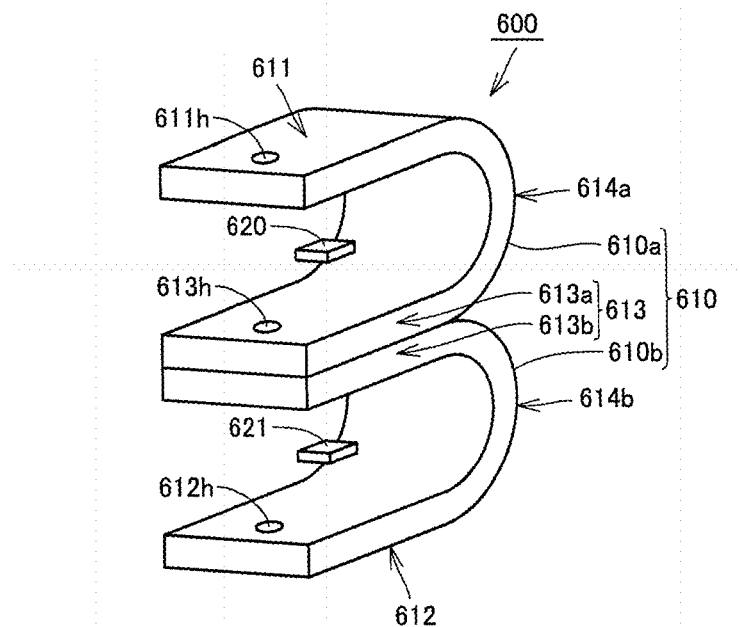
FIG. 25 is a perspective view showing a portion of a configuration of a current sensor according to a fourth embodiment of the invention.

FIG. 25 is a perspective view showing a portion of a configuration of the current sensor according to the fourth embodiment of the invention. FIG. 25 does not illustrate a hold portion. As shown in FIG. 25, the current sensor 600 according to the fourth embodiment of the invention includes a busbar 610 through which current of a measurement subject flows.

Also, the current sensor 600 includes a first magnetic sensor 620 and a second magnetic sensor 621 that each have odd function input/output characteristics and detect the intensity of a magnetic field generated by the current of the measurement subject flowing through the busbar 610.

Further, the current sensor 600 includes a subtracter (not shown) serving as calculating means for calculating a value of the current by executing subtraction on the respective detection values of the first magnetic sensor 620 and the second magnetic sensor 621.

In this embodiment, the busbar 610 includes a first busbar member 610$a$ forming a first busbar portion 611 and a portion 613$a$ of a third busbar portion, and a second busbar member 610$b$ forming a second busbar portion 612 and a portion 613$b$ of the third busbar portion.

To be specific, the first busbar member 610$a$ and the second busbar member 610$b$ have the same U-like shape in plan view.

In the first busbar member 610$a$, one end in the longitudinal direction of the first busbar portion 611 and one end in the longitudinal direction of the portion 613$a$ of the third busbar portion located in parallel to each other with a gap interposed therebetween are coupled to each other by a curved first coupling portion 614$a$.

In the second busbar member 610$b$, one end in the longitudinal direction of the second busbar portion 612 and one end in the longitudinal direction of the portion 613$b$ of the third busbar portion located in parallel to each other with a gap interposed therebetween are coupled to each other by a curved first coupling portion 614$b$.

A third busbar portion 613 is formed of the portion 613a of the third busbar portion in the first busbar member 610a and the portion 613b of the third busbar portion in the second busbar member 610b.

A first through hole 611h is provided at the other end in the longitudinal direction of the first busbar portion 611, a second through hole 612h is provided at the other end in the longitudinal direction of the second busbar portion 612, and a third through hole 613h is provided at the other end in the longitudinal direction of the third busbar portion 613.

The first through hole 611h and the second through hole 612h are provided for connecting input wiring. The third through hole 613h is provided for connecting output wiring. However, the first through hole 611h and the second through hole 612h may be used for connecting the output wiring, and the third through hole 613h may be used for connecting the input wiring.

The first busbar member 610a and the second busbar member 610b are joined, and are in contact with each other at the respective portions of the third busbar portion 613. To be specific, a surface of the portion 613a of the third busbar portion at the side opposite to the first busbar member 610a side and a surface of the portion 613b of the third busbar portion at the side opposite to the second busbar member 610b side are in contact with each other.

In this embodiment, the first busbar member 610a and the second busbar member 610b are joined by welding. However, the joining method of both members is not limited to welding, and both members may be joined by brazing, soldering, fastening with a bolt and a nut, fastening with a rivet, fitting of both members, crimping of both members, or the like.

Alternatively, the busbar 610 may be formed by insert molding using insulating resin. In this case, only the peripheries of the first through hole 611h, the second through hole 612h, and the third through hole 613h are exposed, and the other portion of the busbar 610 is molded with insulating resin.

Accordingly, the joint strength between the first busbar member 610a and the second busbar member 610b can be increased, and insulation sealing can be provided for the portion other than the connection portion of the busbar 610 with respect to the external wiring.

The third busbar portion 613 of the busbar 610 according to this embodiment is formed of the portion 613a of the third busbar portion in the first busbar member 610a and the portion 613b of the third busbar portion in the second busbar member 610b. Accordingly, if the dimensions of the first busbar portion 611 and the second busbar portion 612 of the busbar 610 according to this embodiment are equal to the dimensions of the first busbar portion 511 and the second busbar portion 512 of the busbar 510 according to the third embodiment, the third busbar portion 613 of the busbar 610 according to this embodiment has an area in a cross section that is twice of the area of the third busbar portion 513 of the busbar 510 according to the third embodiment. Hence, the electrical resistance at the third busbar portion 613 is halved, and the allowable current of the busbar 610 can be increased.

Even with the current sensor 600 according to this embodiment, the influence of the external magnetic field can be decreased. Also, since high accuracy is not required for the arrangement of the first magnetic sensor 620 or the second magnetic sensor 621, the current sensor 600 can be easily manufactured.

That is, the first recess portion that houses the first magnetic sensor 620 and the second recess portion that houses the second magnetic sensor 621 can be easily formed at the positions at which the first magnetic sensor 620 and the second magnetic sensor 621 should be arranged.

It is to be noted that the first busbar member 610a and the second busbar member 610b do not have to have the same shape. However, in case of the same shape, the number of kinds of members to be prepared can be decreased, and the current sensor 600 can execute stable detection by symmetrically arranging the first magnetic sensor 620 and the second magnetic sensor 621 with respect to the busbar 610.

In the current sensor according to this embodiment, since the busbar module and the magnetic sensor module are the separate configurations, the user of the current sensor can customize the current sensor by selecting a combination of a structure of busbar and a type of magnetic sensor.

A current sensor according to a fifth embodiment of the invention is described below with reference to the drawings. A current sensor 700 according to this embodiment differs from the current sensor 600 according to the fourth embodiment only in that an input terminal portion and an output terminal portion are extended in mutually opposite directions. Therefore, the description of the other configuration will not be repeated.

Fifth Embodiment

Figure 26:
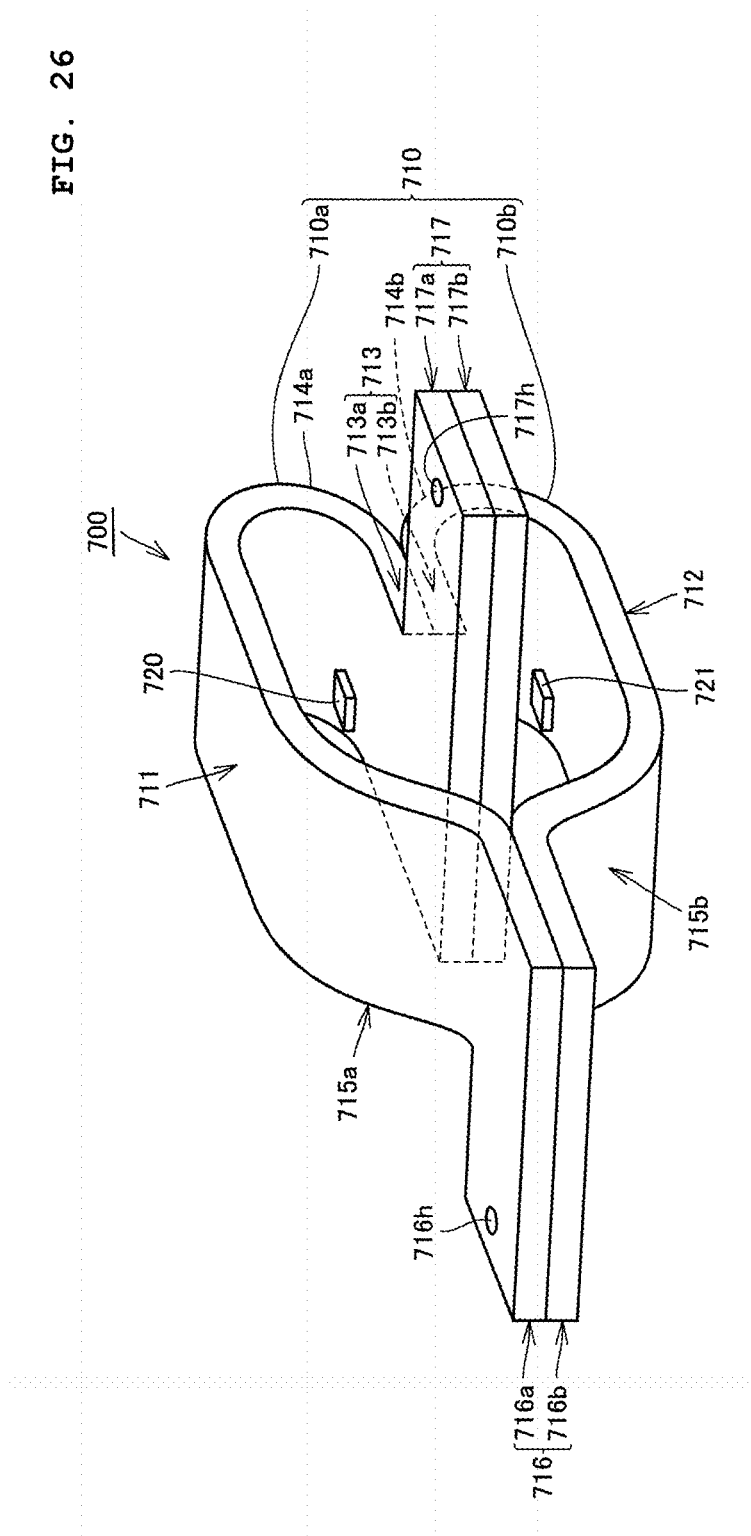
FIG. 26 is a perspective view showing a portion of a configuration of a current sensor according to a fifth embodiment of the invention.

FIG. 26 is a perspective view showing a portion of a configuration of the current sensor according to the fifth embodiment of the invention. As shown in FIG. 26, the current sensor 700 according to the fifth embodiment of the invention includes a busbar 710 through which current of a measurement subject flows.

Also, the current sensor 700 includes a first magnetic sensor 720 and a second magnetic sensor 721 that each have odd function input/output characteristics and detect the intensity of a magnetic field generated by the current of the measurement subject flowing through the busbar 710.

Further, the current sensor 700 includes a subtracter (not shown) serving as calculating means for calculating a value of the current by executing subtraction on the respective detection values of the first magnetic sensor 720 and the second magnetic sensor 721.

In this embodiment, the busbar 710 includes a first busbar member 710a forming a first busbar portion 711 and a portion 713a of a third busbar portion, and a second busbar member 710b forming a second busbar portion 712 and a portion 713b of the third busbar portion.

The busbar 710 includes an input terminal portion 716 for inputting current to the first busbar portion 711 and the second busbar portion 712, and an output terminal portion 717 for outputting current from a third busbar portion 713.

In the first busbar member 710a, one end of the first busbar portion 711 and one end of the portion 713a of the third busbar portion located in parallel to each other with a gap interposed therebetween are coupled to each other by a curved first coupling portion 714a.

In the second busbar member 710b, one end of the second busbar portion 712 and one end of a portion 713b of the third busbar portion located in parallel to each other with a gap interposed therebetween are coupled to each other by a curved first coupling portion 714b.

The third busbar portion 713 of the busbar 710 is formed of the portion 713a of the third busbar portion in the first busbar member 710a and the portion 713b of the third busbar portion in the second busbar member 710b.

The input terminal portion 716 of the busbar 710 is formed of a portion 716a of the input terminal portion in the first busbar member 710a, and a portion 716b of the input terminal portion in the second busbar member 710b.

The output terminal portion 717 of the busbar 710 is formed of a portion 717a of the output terminal portion in the first busbar member 710a, and a portion 717b of the output terminal portion in the second busbar member 710b.

The input terminal portion 716 and the output terminal portion 717 are located in the same plane, and extend in mutually opposite directions in the directions of detection axes of the first magnetic sensor 720 and the second magnetic sensor 721. The left-right direction in FIG. 26 corresponds to the directions of the detection axes of the first magnetic sensor 720 and the second magnetic sensor 721.

To be specific, in the first busbar member 710a, the other end of the first busbar portion 711 and one end of the portion 716a of the input terminal portion are coupled to each other by a curved second coupling portion 715a.

The portion 716a of the input terminal portion extends in the left direction in FIG. 26 from the second coupling portion 715a. The portion 717a of the output terminal portion extends in the right direction in FIG. 26 from the other end of the portion 713a of the third busbar portion. The portion 716a of the input terminal portion and the portion 717a of the output terminal portion are located in the same plane.

In the second busbar member 710b, the other end of the second busbar portion 712 and one end of the portion 716b of the input terminal portion are coupled to each other by a curved second coupling portion 715b.

The portion 716b of the input terminal portion extends in the left direction in FIG. 26 from the second coupling portion 715b. The portion 717b of the output terminal portion extends in the right direction in FIG. 26 from the other end of the portion 713b of the third busbar portion. The portion 716b of the input terminal portion and the portion 717b of the output terminal portion are located in the same plane.

A first through hole 716h is provided at the other end of the input terminal portion 716, and a second through hole 717h is provided at the other end of the output terminal portion 717.

The first through hole 716h is a hole for connecting input wiring. The second through hole 717h is a hole for connecting output wiring. However, the first through hole 716h may be used for connecting the output wiring, and the second through hole 717h may be used for connecting the input wiring. Only the peripheries of the first through hole 716h and the second through hole 717h are exposed from the hold portion.

The first busbar member 710a and the second busbar member 710b are in contact with each other at the respective portions of the third busbar portion 713. In this embodiment, the first busbar member 710a and the second busbar member 710b are also in contact with each other at the respective portions of the input terminal portion 716 and the respective portions of the output terminal portion 717.

In the current sensor 700 according to this embodiment, since the input terminal portion 716 and the output terminal portion 717 are extended in the mutually opposite directions, short circuit of the external wiring connected to the busbar 710 can be restricted, and connection to the external wiring can be easily provided.

Even with the current sensor 700 according to this embodiment, the influence of the external magnetic field can be decreased. Also, since high accuracy is not required for the arrangement of the first magnetic sensor 720 or the second magnetic sensor 721, the current sensor 700 can be easily manufactured.

That is, first recess portion that houses the first magnetic sensor 720 and the second recess portion that houses the second magnetic sensor 721 can be easily formed at the positions at which the first magnetic sensor 720 and the second magnetic sensor 721 should be arranged.

In the current sensor according to this embodiment, since the busbar module and the magnetic sensor module are the separate configurations, the user of the current sensor can customize the current sensor by selecting a combination of a structure of busbar and a type of magnetic sensor.

A current sensor according to a sixth embodiment of the invention is described below with reference to the drawings. A current sensor 800 according to this embodiment differs from the current sensor 400 according to the second embodiment only in that a busbar is connected in series. Therefore, the description of the other configuration will not be repeated.

Sixth Embodiment

Figure 27:
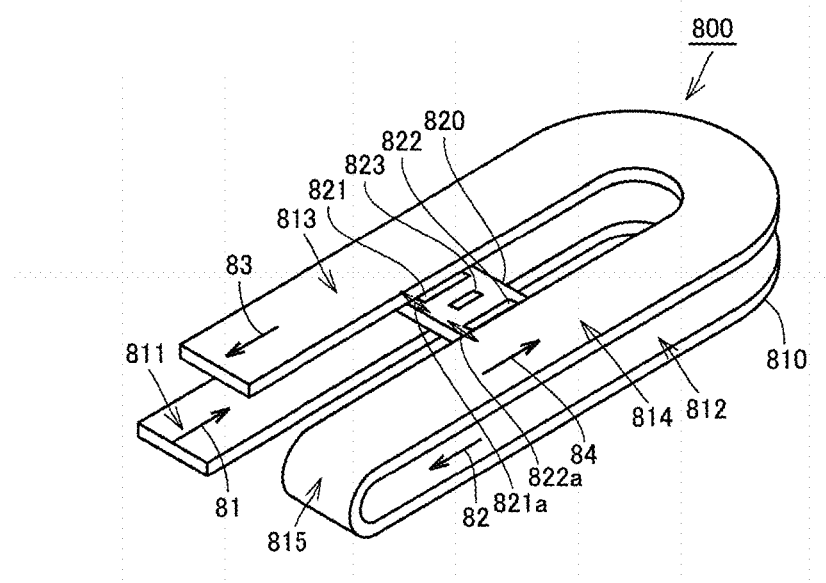
FIG. 27 is a perspective view showing a portion of a configuration of a current sensor according to a sixth embodiment of the invention.

FIG. 27 is a perspective view showing a portion of a configuration of the current sensor according to the sixth embodiment of the invention. As shown in FIG. 27, the current sensor 800 according to the sixth embodiment of the invention includes a busbar 810 through which current of a measurement subject flows.

Also, the current sensor 800 includes a first magnetic sensor 821 and a second magnetic sensor 822 that each have odd function input/output characteristics and detect the intensity of a magnetic field generated by the current of the measurement subject flowing through the busbar 810. The first magnetic sensor 821 and the second magnetic sensor 822 are assembled in a single magnetic sensor module 820.

Further, the current sensor 800 includes a subtracter 823 serving as calculating means for calculating a value of the current by executing subtraction on the respective detection values of the first magnetic sensor 821 and the second magnetic sensor 822.

In this embodiment, the busbar 810 is formed of a single busbar member. In the busbar member, two U-like portions, each of which is curved in the same plane, face each other, and one ends of the U-like portions are bent so as to be connected.

To be specific, in a first U-like portion, a first busbar portion 811 and a second busbar portion 812 are provided in parallel in the same plane. In a second U-like portion, a third busbar portion 813 and a fourth busbar portion 814 are provided in parallel in the same plane.

One end of the second busbar portion 812 and one end of the fourth busbar portion 814 are coupled to each other by a curved coupling portion 815. Accordingly, the busbar 810 is connected in series.

Hence, the current flowing through the busbar 810 flows through the first busbar portion 811 in a direction indicated by an arrow 81, through the second busbar portion 812 in a direction indicated by an arrow 82, through the third busbar portion 813 in a direction indicated by an arrow 83, and through the fourth busbar portion 814 in a direction indicated by an arrow 84.

The first busbar portion 811 and the third busbar portion 813 face each other with a gap interposed therebetween. The second busbar portion 812 and the fourth busbar portion 814 face each other with a gap interposed therebetween.

The first magnetic sensor 821 is located between the first busbar portion 811 and the third busbar portion 813. The second magnetic sensor 822 is located between the second busbar portion 812 and the fourth busbar portion 814.

The first magnetic sensor 821 has a detection axis in a direction indicated by an arrow 821a in FIG. 27, that is, a direction being orthogonal to the arrangement direction of the first busbar portion 811 and the third busbar portion 813, and a direction being orthogonal to the extending direction of the first and third busbar portions 811 and 813.

The second magnetic sensor 822 has a detection axis in a direction indicated by an arrow 822a in FIG. 27, that is, a direction being orthogonal to the arrangement direction of the second busbar portion 812 and the fourth busbar portion 814, and a direction being orthogonal to the extending direction of the second and fourth busbar portions 812 and 814.

The first magnetic sensor 821 and the second magnetic sensor 822 each have odd function input/output characteristics that output a magnetic field as a positive value in case of detecting the magnetic field oriented in one direction of the detection axis, and output a magnetic field as a negative value in case of detecting the magnetic field oriented in a direction opposite to the one direction of the detection axis. That is, regarding the intensity of the magnetic field generated by the current flowing through the busbar 810, the phase of the detection value of the first magnetic sensor 821 is opposite to the phase of the detection value of the second magnetic sensor 822.

The subtracter 823 calculates the value of the current flowing through the busbar 810 by executing subtraction on the detection value of the first magnetic sensor 821 and the detection value of the second magnetic sensor 822.

Even with the current sensor 800 according to this embodiment, the influence of the external magnetic field can be decreased. Also, since high accuracy is not required for the arrangement of the first magnetic sensor 821 or the second magnetic sensor 822, the current sensor 800 can be easily manufactured.

That is, the recess portion that houses the magnetic sensor module 820 can be easily formed at a position at which the magnetic sensor module 820 should be arranged.

In the current sensor according to this embodiment, since the busbar module and the magnetic sensor module are the separate configurations, the user of the current sensor can customize the current sensor by selecting a combination of a structure of busbar and a type of magnetic sensor.

As the electronic device incorporating the current sensor according to any of the above-described embodiments and modifications, there may be a power module, a motor driver, a fuse device, a wire break alarm, a disconnection alarm, an electricity meter, or the like.

It should be considered that the embodiments currently disclosed are merely examples in all viewpoints and are not limited thereto. The scope of the invention is not represented by the above description but represented by the claims. It is intended that the scope of the invention includes all modifications within the meaning equivalent to the claims and within the claims.

REFERENCE SIGNS LIST

10, 30, 400, 500, 600, 700, 800 current sensor
20a, 20b screw
21a first wire harness
21b second wire harness
21c third wire harness
22a, 22b, 22c end terminal
40 external magnetic field source
100, 300 busbar module
110, 410, 410a, 510, 610, 710, 810, 910 busbar
111, 411, 511, 611, 711, 811, 911 first busbar portion
112, 412, 512, 612, 712, 812, 912 second busbar portion
113, 413, 513, 613, 713, 813 third busbar portion
113e, 411e, 412e, 413e, 511e, 512e, 513e magnetic field
114, 414, 514, 614a, 614b, 714a, 714b first coupling portion
115 first extension portion
116 second extension portion
117, 415, 715a, 715b second coupling portion
118, 716 input terminal portion
118h, 411h, 611h, 716h first through hole
119, 717 output terminal portion
119h, 412h, 612h, 717h second through hole
120, 320 hold portion
130, 330 recess portion
130a, 330a first recess portion
130b, 330b second recess portion
131a, 131b main-body recess portion
132a, 132b upper recess portion
133a, 133b internal thread
200, 820 magnetic sensor module
200a first magnetic sensor module
200b second magnetic sensor module
200c third magnetic sensor module
201, 201a, 201b main body portion
202, 202a, 202b protrusion portion
203, 203a, 203b hole portion
204 input terminal group
204a first input terminal group
204b second input terminal group
205 output terminal group
205a first output terminal group
205b second output terminal group
210, 210x sensor circuit
210a first sensor circuit
210b second sensor circuit
211 magnetic sensor
211a, 420, 420y, 420z, 520, 620, 720, 821 first magnetic sensor
211b, 421, 421y, 421z, 521, 621, 721, 822 second magnetic sensor
212 amplifier
212a first amplifier
212b second amplifier
213 exciting coil portion
213a exciting coil driver
213b exciting coil
213c current detection resistor
214, 430, 530, 823 subtracter
214a first subtracter
214b second subtracter
215a first sensor driver
215b second sensor driver
216 sensor output terminal
216a first sensor output terminal
216b second sensor output terminal
217 addition input terminal
217a first addition input terminal
218 subtraction input terminal
218a first subtraction input terminal
218b second subtraction input terminal
219 subtraction output terminal
219a first subtraction output terminal 219b second subtraction output terminal
221a first positive supply input terminal
221b second positive supply input terminal
222a first negative supply input terminal
222b second negative supply input terminal
223a first ground input terminal
223b second ground input terminal
224a first positive supply output terminal
224b second positive supply output terminal
225a first negative supply output terminal
225b second negative supply output terminal
226a first ground output terminal
226b second ground output terminal
230, 231, 232, 233, 234 external wiring
310a first busbar
310b second busbar
310c third busbar
318a first input terminal portion
318b second input terminal portion
318c third input terminal portion
319a first output terminal portion
319b second output terminal portion
319c third output terminal portion
330c third recess portion
340 inverter
413c center point
413h third through hole
413h' second internal thread
413x center line
415h first internal thread
441 first connection wiring
442 second connection wiring
470 input wiring
471 output wiring
480 nut
490 bolt
815, 913 coupling portion
610a, 710a first busbar member
610b, 710b second busbar member
814 fourth busbar portion

The invention claimed is:

1. A current sensor, comprising:
a housing;
a busbar extending through and being integral with the housing, the housing having a recess; and
a magnetic sensor module located in the recess and including a magnetic sensor having odd function input/output characteristics, the magnetic sensor being configured to detect an intensity of a magnetic field generated by current flowing through the busbar.

2. The current sensor according to claim 1, wherein:
the recess of the housing comprises a fitting structure; and
the magnetic sensor module has an outer shape that corresponds to a shape of the fitting structure.

3. The current sensor according to claim 2, wherein the busbar module includes an electrical device held by the housing together with the busbar in a state in which the electrical device is coupled to the busbar.

4. The current sensor according to claim 1, wherein the magnetic sensor module further includes a calculating circuit configured to calculate a value of the current by arithmetically operating a detection value of the magnetic sensor.

5. The current sensor according to claim 4, wherein the recess is a first recess and the magnetic sensor module is a first magnetic sensor module and the housing further includes a second recess having the second magnetic sensor module located therein, the second magnetic sensor module including a magnetic sensor configured to detect the intensity of the magnetic field generated by the current flowing through the busbar.

6. The current sensor according to claim 5, wherein a phase of a detection value of the first magnetic sensor is opposite to a phase of a detection value of the second magnetic sensor with regard to the intensity of the magnetic field generated by the current flowing through the busbar.

7. The current sensor according to claim 6, wherein the calculating circuit is a subtracter.

8. The current sensor according to claim 5, wherein a phase of a detection value of the first magnetic sensor is the same as a phase of a detection value of the second magnetic sensor with regard to the intensity of the magnetic field generated by the current flowing through the busbar.

9. The current sensor according to claim 8, wherein the calculating circuit is an adder.

10. The current sensor according to claim 5, wherein both the first and second magnetic sensor modules each include a circuit having a closed loop of an exciting coil.

11. The current sensor according to claim 1, wherein:
the busbar includes first, second and third busbar portions lying in respective spaced, parallel planes with the third busbar portion being located between the first and second busbar portions, the first and third busbar portions being electrically connected in parallel, the third busbar portion being electrically connected in series with the first and second busbar portions,
the current flows through the first busbar portion in a same direction as the second busbar portion, and
the current flows through the third busbar portion in a direction opposite to the current flow through the first and second busbar portions.

12. The current sensor according to claim 11, wherein the recess is a first recess which is located in the gap between the first and third busbar portions and the current sensor further comprises a second recess which is located in the gap between the second and third busbar portions.

13. The current sensor according to claim 12, wherein the planes in which the first, second and third busbar portions lie are parallel to respective detection axes of the first and second magnetic sensors.

14. The current sensor according to claim 1, wherein the housing comprises a resin material.

15. The current sensor according to claim 1, wherein:
the busbar includes an input terminal configured to input current to the current sensor, and an output terminal configured to output current from the current sensor, and
the input terminal and the output terminal are disposed in a same plane and extend in mutually opposite directions in a direction of a detection axis of the magnetic sensor.

16. An electronic device incorporating the current sensor according to claim 1.

17. The current sensor according to claim 1, wherein:
the busbar includes first and second planar busbar portions lying in parallel planes with a gap interposed therebetween;
the recess is located in the gap; and
the magnetic sensor module has a detection axis which lies in the gap and is parallel to the planes of the busbar portions.

18. The current sensor according to claim 17, wherein a dimension of each of the first and second busbar portions as measured in the direction of the detection axis is at least 1.5 times a dimension of the gap as measured in a direction which is orthogonal to the parallel planes in which the first and second busbar portions lie.

19. A current sensor, comprising:
a busbar integrally formed with a housing, the busbar including first and second planar busbar portions lying in respective parallel planes with a gap interposed there between, the housing having a recess located in the gap; and
a magnetic sensor module located in the recess, the magnetic sensor module including a magnetic sensor configured to detect an intensity of a magnetic field generated by a current flowing through the busbar, the magnetic sensor having a detection axis which lies in the gap and is parallel to the planes in which the busbar portions lie, a dimension of each of the first and second busbar portions as measured in the direction of the detection axis being at least 1.5 times a dimension of the gap as measured in a direction which is orthogonal to the parallel planes in which the first and second busbar portions lie.

20. The current sensor according to claim 19, wherein:
the recess of the housing comprises a fitting structure; and
the magnetic sensor module e has an outer shape that corresponds to a shape of the fitting structure.

21. The current sensor according to claim 20, wherein the busbar module includes an electrical device held by the housing together with the busbar in a state in which the electrical device is coupled to the busbar.

22. The current sensor according to claim 19, wherein the magnetic sensor module further includes a calculating circuit configured to calculate a value of the current by arithmetically operating a detection value of the magnetic sensor.

23. The current sensor according to claim 22, wherein the recess is a first recess and the magnetic sensor module is a first magnetic sensor module and the housing further includes a second recess having the second magnetic sensor module located therein, the second magnetic sensor module including a magnetic sensor configured to detect the intensity of the magnetic field generated by the current flowing through the busbar.

24. The current sensor according to claim 23, wherein a phase of a detection value of the first magnetic sensor is opposite to a phase of a detection value of the second magnetic sensor with regard to the intensity of the magnetic field generated by the current flowing through the busbar.

25. The current sensor according to claim 24, wherein the calculating circuit is a subtracter.

26. The current sensor according to claim 23, wherein a phase of a detection value of the first magnetic sensor is the same as a phase of a detection value of the second magnetic sensor with regard to the intensity of the magnetic field generated by the current flowing through the busbar.

27. The current sensor according to claim 26, wherein the calculating circuit is an adder.

28. The current sensor according to claim 23, wherein both the first and second magnetic sensor modules each include a circuit having a closed loop of an exciting coil.

29. The current sensor according to claim 19, wherein:
the busbar includes first, second and third busbar portions lying in respective spaced, parallel planes with the third busbar portion being located between the first and second busbar portions, the first, second and third busbar portions being electrically connected in parallel;
the current flows through the first busbar portion in a same direction as the second busbar portion, and
the current flows through the third busbar portion in a direction opposite to the current flow through the first and second busbar portions.

30. The current sensor according to claim 29, wherein the recess is a first recess which is located in the gap between the first and third busbar portions and the current sensor further comprises a second recess which is located in the gap between the second and third busbar portions.

31. The current sensor according to claim 30, wherein the planes in which the first, second and third busbar portions lie being parallel to respective detection axes of the first and second magnetic sensors.

32. The current sensor according to claim 19, wherein the housing comprises a resin material.

33. The current sensor according to claim 19, wherein:
the busbar includes an input terminal configured to input current to the current sensor, and an output terminal configured to output current from the current sensor, and
the input terminal and the output terminal are disposed in a same plane and extend in mutually opposite directions in a direction of a detection axis of the magnetic sensor.

34. An electronic device incorporating the current sensor according to claim 19.

* * * * *